US012740274B2

(12) United States Patent
Kim et al.

(10) Patent No.: US 12,740,274 B2
(45) Date of Patent: Sep. 15, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Doyoung Kim, Beijing (CN); Pengfei Yu, Beijing (CN); Yi Zhang, Beijing (CN); Yunsheng Xiao, Beijing (CN); Tingliang Liu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 771 days.

(21) Appl. No.: 17/441,702

(22) PCT Filed: Dec. 17, 2020

(86) PCT No.: PCT/CN2020/137121

§ 371 (c)(1),
(2) Date: Sep. 22, 2021

(87) PCT Pub. No.: WO2022/126469

PCT Pub. Date: Jun. 23, 2022

(65) Prior Publication Data

US 2022/0399433 A1 Dec. 15, 2022

(51) Int. Cl.
*H10K 59/131* (2023.01)
*H10K 59/35* (2023.01)

(52) U.S. Cl.
CPC ....... *H10K 59/1315* (2023.02); *H10K 59/353* (2023.02)

(58) Field of Classification Search
CPC ................................................ H10K 59/1315
See application file for complete search history.

(56) References Cited

U.S. PATENT DOCUMENTS 5,838,287 A 11/1998 Kuijk
2008/0049156 A1* 2/2008 Kim ................. G02F 1/136286 349/40

(Continued)

FOREIGN PATENT DOCUMENTS

CN 101750774 A 6/2010
CN 201868071 U 6/2011

(Continued)

OTHER PUBLICATIONS

Office Action dated Sep. 1, 2025 for CN 202080003376.1 and English Translation.

*Primary Examiner* — Eric K Ashbahian

(57) ABSTRACT

Provided is a display substrate, which includes a substrate, a plurality of sub-pixels, a plurality of data lines, a plurality of signal input pads, a data fan-out line layer, and a plurality of resistance compensation units. The substrate includes a display region and a bezel region located region on a periphery of the display region, and the bezel region includes a signal access region located on a side of the display region and a fan-out region located between the display region and the signal access region. The data fan-out line layer and the plurality of resistance compensation units are disposed in the fan-out region, and the data fan-out line layer includes a plurality of data fan-out lines. At least one resistance compensation unit includes a semiconductor structure. At least one data fan-out line is connected in series with and electrically connected to at least one resistance compensation unit.

17 Claims, 8 Drawing Sheets

(56) References Cited

U.S. PATENT DOCUMENTS

| | | | | |
|---|---|---|---|---|
| 2015/0009438 | A1* | 1/2015 | Du | G02F 1/1345 174/260 |
| 2016/0026047 | A1 | 1/2016 | Chen | |
| 2018/0130856 | A1* | 5/2018 | Kim | H10K 59/1315 |
| 2018/0197484 | A1* | 7/2018 | Moon | H10K 59/123 |
| 2019/0081128 | A1 | 3/2019 | Yu et al. | |
| 2019/0147801 | A1 | 5/2019 | Chu et al. | |
| 2019/0332241 | A1* | 10/2019 | Wang | G06F 3/04164 |
| 2020/0219962 | A1* | 7/2020 | Park | G09G 3/3258 |
| 2020/0295117 | A1* | 9/2020 | Park | H10K 59/1315 |
| 2021/0183892 | A1* | 6/2021 | Ma | H01L 27/1255 |
| 2021/0234079 | A1 | 7/2021 | Han | |
| 2023/0215305 | A1* | 7/2023 | Wang | G09G 3/3225 345/76 |

FOREIGN PATENT DOCUMENTS

| | | | | |
|---|---|---|---|---|
| CN | 104076544 | A | 10/2014 | |
| CN | 105182646 | A | 12/2015 | |
| CN | 106990869 | A | 7/2017 | |
| CN | 108010942 | * | 5/2018 | H10K 59/12 |
| CN | 108010942 | A | 5/2018 | |
| CN | 108281089 | A | 7/2018 | |
| CN | 108447887 | A | 8/2018 | |
| CN | 109273503 | A | 1/2019 | |
| CN | 109950222 | A | 6/2019 | |
| KR | 10-2008-0042378 | A | 5/2008 | |

* cited by examiner

DISPLAY SUBSTRATE AND DISPLAY APPARATUS

TECHNICAL FIELD

The present disclosure relates to, but is not limited to, the field of display technology, in particular to a display substrate and a display apparatus.

BACKGROUND

With continuous development of display technology, there are more and more types of display products, such as a Liquid Crystal Display (LCD), an Organic Light-Emitting Diode (OLED) display, a Plasma Display Panel (PDP), and a Field Emission Display (FED).

SUMMARY

The following is a summary of subject matter described in detail herein. This summary is not intended to limit the protection scope of the claims.

An embodiment of the present disclosure provides a display substrate and a display apparatus.

In one aspect, an embodiment of the present disclosure provides a display substrate, which includes a substrate, a plurality of sub-pixels, a plurality of data lines, a plurality of signal input pads, a data fan-out line layer, and a plurality of resistance compensation units. The substrate includes a display region and a bezel region on a periphery of the display region. The bezel region includes a signal access region located on a side of the display region and a fan-out region located between the display region and the signal access region. The plurality of sub-pixels are located in the display region. The plurality of data lines are located in the display region and are electrically connected to the plurality of sub-pixels, wherein the plurality of data lines are configured to provide data signals to the plurality of sub-pixels. The plurality of signal input pads are located in the signal access region. The data fan-out line layer and a plurality of resistance compensation units are disposed in the fan-out region. The data fan-out line layer includes a plurality of data fan-out lines configured to be connected to the plurality of data lines and the plurality of signal input pads disposed in the signal access region. At least one of the plurality of resistance compensation units has a semiconductor structure. At least one of the plurality of data fan-out lines is connected in series with and electrically connected to at least one resistance compensation unit.

In some exemplary embodiments, an area of the semiconductor structure of the resistance compensation unit is positively proportional to a resistance value to be compensated for the data fan-out line connected in series with the resistance compensation unit.

In some exemplary embodiments, a total area of semiconductor structures of the resistance compensation units connected in series with data fan-out lines with a smaller resistance value is larger than a total area of semiconductor structures of the resistance compensation units connected in series with data fan-out lines with a larger resistance value.

In some exemplary embodiments, the at least one of the plurality of resistance compensation units further has a conductive connection structure; the semiconductor structure and the conductive connection structure are sequentially disposed on the substrate and are electrically connected.

In some exemplary embodiments, the conductive connection structure of the resistance compensation unit includes a first connection electrode and a second connection electrode. A data fan-out line connected in series with the resistance compensation unit includes a first part and a second part that are disconnected. The first part of the data fan-out line is connected to the semiconductor structure of the resistance compensation unit through the first connection electrode, and the second part of the data fan-out line is connected to the semiconductor structure through the second connection electrode.

In some exemplary embodiments, the first part has a first terminal and a first extension portion connected to each other, and the second part has a second terminal and a second extension portion connected to each other. The first terminal is connected to the semiconductor structure through the first connection electrode, and the second terminal is connected to the semiconductor structure through the second connection electrode. A length of the first terminal along a first direction is greater than a length of the first extension portion along the first direction, and a length of the second terminal along the first direction greater than a length of the second extension portion along the first direction. The first direction is perpendicular to an extension direction of a data line in the display region.

In some exemplary embodiments, the plurality of data fan-out lines in the fan-out region are connected in series with and electrically connected to the plurality of resistance compensation units in one-to-one correspondence.

In some exemplary embodiments, the plurality of resistance compensation units are sequentially disposed along a direction perpendicular to an extension direction of data lines of the display region, or staggered along a direction parallel to an extension direction of data lines of the display region.

In some exemplary embodiments, along a direction from an edge of the fan-out region to middle of the fan-out region, a total area of a semiconductor structure of a resistance compensation unit electrically connected to a plurality of data fan-out lines in the fan-out region increases, or increases first and then decreases.

In some exemplary embodiments, the fan-out region has a plurality of fan-out sub-regions in a direction perpendicular to an extension direction of a data line of the display region. Resistance compensation units electrically connected to a plurality of data fan-out lines in at least one fan-out sub-region are sequentially disposed along a direction perpendicular to the extension direction of the data lines of the display region, or staggered along a direction parallel to the extension direction of the data lines of the display region.

In some exemplary embodiments, along a direction from an edge of the fan-out region to middle of the fan-out region, a total area of semiconductor structures of resistance compensation units electrically connected to a plurality of data fan-out lines in at least one fan-out sub-region increases, or increases first and then decreases.

In some exemplary embodiments, the semiconductor structure is located on a side of the data fan-out line layer close to the substrate, and the conductive connection structure is located on a side of the data fan-out line layer away from the substrate.

In some exemplary embodiments, the bezel region further includes a bending region located between the signal access region and the display region. The fan-out region includes a first fan-out region located between the display region and the bending region, and a second fan-out region located between the bending region and the signal access region. The at least one data fan-out line includes a first sub-data fan-out line located in the first fan-out region and a second sub-data fan-out line located in the second fan-out region and connected to the first sub-data fan-out line. The at least one resistance compensation unit is configured to satisfy one of the following: disposed in the first fan-out region, connected in series with and electrically connected to at least one first sub-data fan-out line; disposed in the second fan-out region, connected in series with and electrically connected to at least one second sub-data fan-out line.

In some exemplary embodiments, the bezel region further includes a bending region between the signal access region and the display region, and a test circuit region between the bending region and the signal access region. The fan-out region includes a first fan-out region between the display region and the bending region, a second fan-out region between the bending region and the test circuit region, and a third fan-out region between the test circuit region and the signal access region. The at least one data fan-out line includes a first sub-data fan-out line located in the first fan-out region, a second sub-data fan-out line located in the second fan-out region and electrically connected to the first sub-data fan-out line, and a third sub-data fan-out line located in the third fan-out region and electrically connected to the second sub-data fan-out line. The at least one resistance compensation unit is configured to satisfy one of the following: disposed in the first fan-out region, connected in series with and electrically connected to at least one first sub-data fan-out line; disposed in the second fan-out region, connected in series with and electrically connected to at least one second sub-data fan-out line; disposed in the third fan-out region, connected in series with and electrically connected to at least one third sub-data fan-out line.

In some exemplary embodiments, the plurality of resistance compensation units are all disposed in the second fan-out region, and at least one second sub-data fan-out line in the second fan-out region is connected in series with and electrically connected to at least one resistance compensation unit.

In some exemplary embodiments, the plurality of resistance compensation units disposed in the second fan-out region are close to the test circuit region or close to the signal access region.

In some exemplary embodiments, the data fan-out line layer includes a first data fan-out line layer and a second data fan-out line layer which are sequentially disposed on the substrate and insulated from each other. The first data fan-out line layer includes a plurality of first data fan-out lines, and the second data fan-out line layer includes a plurality of second data fan-out lines. Orthographic projections of the first data fan-out line layer and the second data fan-out line layer on the substrate are not overlapped, and the plurality of first data fan-out lines and the plurality of second data fan-out lines are disposed at intervals.

In some exemplary embodiments, the display region at least includes a driving structure layer disposed on the substrate and light-emitting elements disposed on the driving structure layer; the light-emitting elements are electrically connected to the driving structure layer. The driving structure layer includes: an active layer, a first gate metal layer, a second gate metal layer, and a source-drain metal layer sequentially disposed on the substrate. The first data fan-out line layer and the first gate metal layer are of the same layer structure, and the second data fan-out line layer and the second gate metal layer are of the same layer structure; the semiconductor structure and the active layer are of the same layer structure; and the conductive connection structure and the source-drain metal layer are of the same layer structure.

In another aspect, an embodiment of the present disclosure provides a display apparatus, which includes the display substrate described above.

Other aspects will become apparent upon reading and understanding accompanying drawings and the detailed description.

BRIEF DESCRIPTION OF DRAWINGS

Accompanying drawings are used to provide a further understanding of technical solutions of the present disclosure and constitute a part of the description to explain the technical solutions of the present disclosure together with embodiments of the present disclosure, and do not constitute any limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
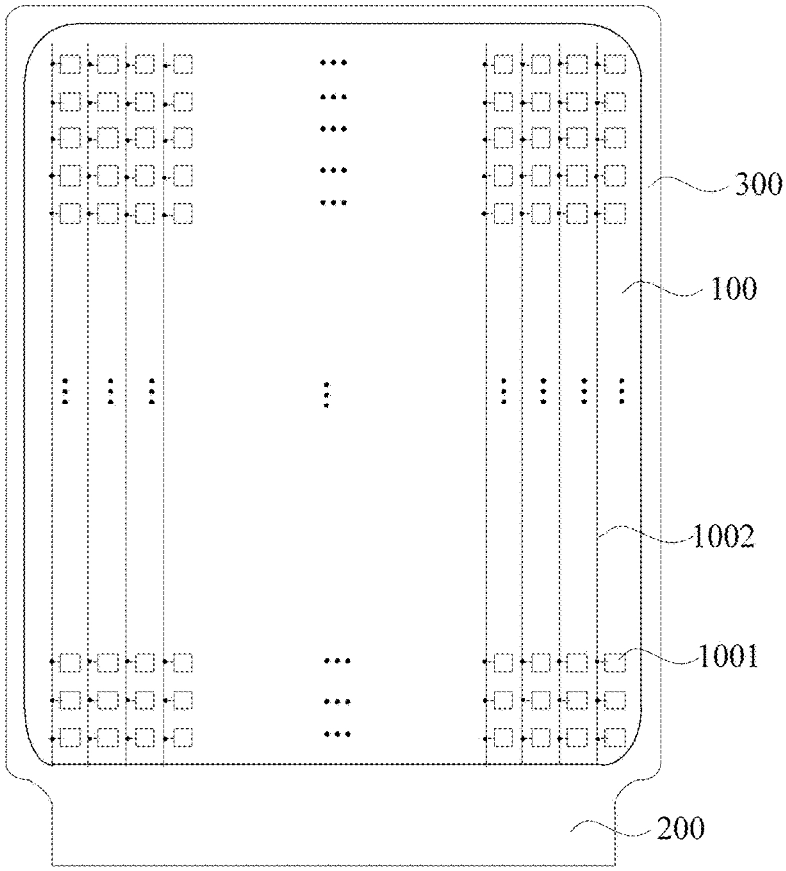
FIG. 1 is a schematic diagram of a display substrate according to at least one embodiment of the present disclosure.

To make objects, technical solutions, and advantages of the present disclosure more clear, embodiments of the present disclosure will be described in detail below with reference to the drawings. The embodiments may be implemented in a plurality of different forms. Those of ordinary skills in the art will readily understand a fact that implementations and contents may be transformed into one or more of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, a size of one or more constituent elements, or a thickness or a region of a layer, is sometimes exaggerated for clarity. Therefore, an implementation of the present disclosure is not necessarily limited to the size, and shapes and sizes of a plurality of components in the drawings do not reflect real scales. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation. In the description of the present disclosure, "a plurality of" means two or more than two.

In the present disclosure, for the sake of convenience, wordings such as "central", "upper", "lower", "front", "rear", "vertical", "horizontal", "top", "bottom", "inner", "outer" and the others describing orientations or positional relations are used to depict positional relations of constituent elements with reference to the drawings, which are only for convenience of describing the specification and simplifying the description, rather than indicating or implying that the device or element referred to must have a specific orientation, or must be constructed and operated in a particular orientation and therefore, those wordings cannot be construed as limitations on the present disclosure. The positional relations of the constituent elements may be appropriately changed according to a direction in which constituent elements are described. Therefore, it is not limited to the wordings described in the specification, and they may be replaced appropriately according to a situation.

In the present disclosure, the terms "installed", "connected", and "coupled" shall be understood in their broadest sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art may understand meanings of the above terms in the present disclosure according to a situation.

In the present disclosure, a transistor refers to an element including at least three terminals, namely, a gate electrode, a drain electrode, and a source electrode. The transistor has a channel region between the drain electrode (a drain electrode terminal, a drain region, or a drain electrode) and the source electrode (a source electrode terminal, a source region, or a source electrode), and a current can flow through the drain electrode, the channel region, and the source electrode. In the present disclosure, the channel region refers to a region through which the current mainly flows.

In the present disclosure, a first electrode may be a drain electrode while a second electrode may be a source electrode, or a first electrode may be a source electrode while a second electrode may be a drain electrode. Functions of the "source electrode" and the "drain electrode" are sometimes interchangeable in a case where transistors with opposite polarities are used or in a case where a direction of a current changes during circuit operation. Therefore, in the present disclosure, the "source electrode" and the "drain electrode" are interchangeable.

In the present disclosure, "an electrical connection" includes a case where constituent elements are connected via an element having an electrical function. The "element with an electrical function" is not particularly limited as long as it can transmit and receive electrical signals between the connected constituent elements. Examples of the "element having an electrical function" not only include electrodes and wirings, but also include switching elements such as transistors, resistors, inductors, capacitors, and other elements with one or more functions.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes a "conductive layer" may be replaced by a "conductive film". Similarly, an "insulating film" may sometimes be replaced by an "insulating layer".

"About" in the present disclosure means that limits of a value are not limited strictly, and the value is within a range of process and measurement errors.

An embodiment of the present disclosure provides a display substrate, which includes a substrate, a plurality of sub-pixels, a plurality of data lines, a plurality of signal input pads, a data fan-out line layer, and a plurality of resistance compensation units. The substrate includes a display region and a bezel region on a periphery of the display region. The bezel region includes a signal access region located on a side of the display region and a fan-out region located between the display region and the signal access region. The plurality of sub-pixels are located in the display region. The plurality of data lines are located in the display region and are electrically connected to the plurality of sub-pixels, wherein the plurality of data lines are configured to provide data signals to the plurality of sub-pixels. The plurality of signal input pads are located in the signal access region. The data fan-out line layer and a plurality of resistance compensation units are disposed in the fan-out region, and the data fan-out line layer includes a plurality of data fan-out lines configured to connect the plurality of data lines and the plurality of signal input pads disposed in the signal access region. At least one resistance compensation unit includes a semiconductor structure, and at least one data fan-out line is connected in series and electrically connected with at least one resistance compensation unit. For example, a data fan-out line is connected in series and electrically connected with a resistance compensation unit, or a data fan-out line is connected in series and electrically connected with a plurality of resistance compensation units. However, this is not limited in the embodiment.

According to the display substrate provided by the embodiment of the present disclosure, a plurality of resistance compensation units are disposed in the fan-out region to compensate resistance values of the plurality of data fan-out lines, reduce a resistance value difference among the plurality of data fan-out lines after compensation, and fix display color deviation or uneven brightness caused by the resistance value difference of the data fan-out lines, thereby improving a display effect.

In some exemplary embodiments, the display substrate of the embodiment may be a Liquid Crystal Display (LCD), an Organic Light-Emitting Diode (OLED) display, a Plasma Display Panel (PDP), or a Field Emission Display (FED). However, a type of the display substrate is not limited in the embodiment.

In some exemplary embodiments, an area of a semiconductor structure of a resistance compensation unit is positively proportional to a resistance value to be compensated for a data fan-out line connected in series with the resistance compensation unit. In other words, the larger the area of the semiconductor structure of the resistance compensation unit, the larger the compensation resistance value provided by the resistance compensation unit; the smaller the area of the semiconductor structure of the resistance compensation unit, the smaller the compensation resistance value provided by the resistance compensation unit.

In some exemplary embodiments, a total area of a semiconductor structure of a resistance compensation unit connected in series with a data fan-out line with a smaller resistance value is larger than a total area of a semiconductor structure of a resistance compensation unit connected in series with a data fan-out line with a larger resistance value. In the exemplary embodiments, by adjusting an area of a semiconductor structure of a resistance compensation unit connected in series with a data fan-out line, different compensation resistance values may be provided for different data fan-out lines, thereby compensating for a resistance value difference between different data fan-out lines.

In some exemplary embodiments, at least one of a plurality of resistance compensation units further includes a conductive connection structure. The semiconductor structure and the conductive connection structure are sequentially disposed on the substrate and are electrically connected. In the exemplary embodiments, an electrical connection between a data fan-out line and a semiconductor structure is achieved through a conductive connection structure.

In some exemplary embodiments, a conductive connection structure of a resistance compensation unit includes a first connection electrode and a second connection electrode. A data fan-out line connected in series with the resistance compensation unit includes a first part and a second part that are disconnected. The first part of the data fan-out line is connected to a semiconductor structure through the first connection electrode of the resistance compensation unit, and the second part of the data fan-out line is connected to a semiconductor structure through the second connection electrode of the resistance compensation unit. In the exemplary embodiments, a series connection between a semiconductor structure and a data fan-out line may be achieved through a conductive connection structure.

In some exemplary embodiments, a plurality of data fan-out lines in a fan-out region are connected in series with a plurality of resistance compensation units in one-to-one correspondence. In other words, a data fan-out line is connected in series with a resistance compensation unit, wherein areas of semiconductor structures of the plurality of resistance compensation units may be different or partially the same. However, this is not limited in the embodiments. In some examples, areas of semiconductor structures of a plurality of resistance compensation units may be the same, and a quantity of resistance compensation units connected in series with at least one data fan-out line may be determined according to a resistance value to be compensated for the data fan-out line.

In some exemplary embodiments, a plurality of data fan-out lines in a fan-out region are electrically connected in series with a plurality of resistance compensation units in one-to-one correspondence. The plurality of resistance compensation units in the fan-out region are sequentially arranged along a first direction or staggered along a second direction perpendicular to the first direction. The first direction is perpendicular to an extension direction of a data line in a display region. For example, an arrangement direction of a plurality of resistance compensation units in a fan-out region is parallel to a first direction, or has an included angle with a first direction. However, this is not limited in the embodiments.

In some exemplary embodiments, along a direction from an edge of a fan-out region to middle of the fan-out region, a total area of a semiconductor structure of a resistance compensation unit electrically connected to a plurality of data fan-out lines in the fan-out region increases, or increases first and then decreases. In the exemplary embodiments, a change of the total area of the semiconductor structure of the resistance compensation unit correlates to a change of a resistance value of a data fan-out line connected with the resistance compensation unit. For example, if a resistance value of a data fan-out line connected with a resistance compensation unit decreases along a direction from an edge of a fan-out region to middle of the fan-out region, a total area of a semiconductor structure of the resistance compensation unit increases along the direction from the edge of the fan-out region to the middle of the fan-out region.

In some exemplary embodiments, a fan-out region has a plurality of fan-out sub-regions in a first direction. The first direction is perpendicular to an extension direction of a data line in a display region. Resistance compensation units connected to a plurality of data fan-out lines in at least one fan-out sub-region are sequentially arranged along a first direction or staggered along a second direction perpendicular to the first direction. In some examples, arrangements of resistance compensation units in a plurality of fan-out sub-regions are the same. For example, arrangement directions of a plurality of resistance compensation units in each fan-out sub-region are all parallel to a first direction, or a plurality of resistance compensation units in each fan-out sub-region are staggered along a second direction. In some examples, arrangements of resistance compensation units in a plurality of fan-out sub-regions are different. For example, arrangement directions of a plurality of resistance compensation units in at least one fan-out sub-region are parallel to a first direction, and a plurality of resistance compensation units in other fan-out sub-regions are staggered along the second direction. However, this is not limited in the embodiments.

In some exemplary embodiments, along a direction from an edge of a fan-out region to middle of the fan-out region, a total area of a semiconductor structure of a resistance compensation unit electrically connected to a plurality of data fan-out lines in at least one fan-out sub-region increases, or increases first and then decreases. However, this is not limited in the embodiments.

In some exemplary embodiments, a semiconductor structure is located on a side of a data fan-out line layer near a substrate, and a conductive connection structure is located on a side of the data fan-out line layer away from the substrate. The semiconductor structure and a data fan-out line of the data fan-out line layer are connected through the conductive connection structure.

In some exemplary embodiments, a bezel region further includes a bending region located between a signal access region and a display region. A fan-out region includes a first fan-out region located between the display region and the bending region, and a second fan-out region located between the bending region and the signal access region. At least one data fan-out line includes a first sub-data fan-out line located in the first fan-out region and a second sub-data fan-out line located in the second fan-out region and connected to the first sub-data fan-out line. At least one resistance compensation unit is configured to satisfy one of the following: at least one resistance compensation unit is disposed in a first fan-out region and is connected in series with and electrically connected to at least one first sub-data fan-out line; and at least one resistance compensation unit is disposed in a second fan-out region and is connected in series with and electrically connected to at least one second sub-data fan-out line. For example, a plurality of resistance compensation units may all be disposed in a first fan-out region; or, a plurality of resistance compensation units are all disposed in a second fan-out region; or, a part of a plurality of resistance compensation units is disposed in a first fan-out region, and the other part is disposed in a second fan-out region. However, this is not limited in the embodiments.

In some exemplary embodiments, a bezel region further includes a bending region between a signal access region and a display region, and a test circuit region between the bending region and the signal access region. A fan-out region includes a first fan-out region between the display region and the bending region, a second fan-out region between the bending region and the test circuit region, and a third fan-out region between the test circuit region and the signal access region. At least one data fan-out line includes a first sub-data fan-out line located in a first fan-out region, a second sub-data fan-out line located in a second fan-out region and electrically connected to the first sub-data fan-out line, and a third sub-data fan-out line located in a third fan-out region and electrically connected to the second sub-data fan-out line. At least one resistance compensation unit is configured to satisfy one of the following: at least one resistance compensation unit is disposed in the first fan-out region and connected in series with and electrically connected to at least one first sub-data fan-out line; at least one resistance compensation unit is disposed in the second fan-out region and connected in series with and electrically connected to at least one second sub-data fan-out line; and at least one resistance compensation unit is disposed in the third fan-out region and connected in series with and electrically connected to at least one third sub-data fan-out line. For example, a plurality of resistance compensation units may all be disposed in the first fan-out region; or, a plurality of resistance compensation units are all disposed in the second fan-out region; or, a plurality of resistance compensation units are all disposed in the third fan-out region; or, a part of a plurality of resistance compensation units is disposed in the first fan-out region, and the other part is disposed in the second fan-out region; or, a part of a plurality of resistance compensation units is disposed in the second fan-out region, and the other part is disposed in the third fan-out region; or, a part of a plurality of resistance compensation units is disposed in the first fan-out region, and the other part is disposed in the third fan-out region; or, a first part of a plurality of resistance compensation units is disposed in the first fan-out region, a second part is disposed in the second fan-out region, and a third part is disposed in the third fan-out region. However, this is not limited in the embodiments.

In some exemplary embodiments, a plurality of resistance compensation units are all disposed in a second fan-out region, and at least one second sub-data fan-out line in the second fan-out region is connected in series with and electrically connected to at least one resistance compensation unit. By arranging a plurality of resistance compensation units in a second fan-out region, a reasonable arrangement of resistance compensation units may be realized, and a narrow bezel may be achieved by reducing a size of a first fan-out region.

In some exemplary embodiments, a plurality of resistance compensation units are all disposed in a second fan-out region. A plurality of resistance compensation units in a second fan-out region are close to a test circuit region or close to a signal access region. In this example, when a second fan-out region is located between a bending region and a test circuit region, a distance between a resistance compensation unit in the second fan-out region and the bending region is greater than a distance between the resistance compensation unit and the test circuit region. When a second fan-out region is located between a bending region and a signal access region, a distance between a resistance compensation unit in the second fan-out region and the bending region is greater than a distance between the resistance compensation unit and the signal access region. However, this is not limited in the embodiments.

In some exemplary embodiments, a data fan-out line layer includes a first data fan-out line layer and a second data fan-out line layer which are sequentially disposed on a substrate and insulated from each other. The first data fan-out line layer includes a plurality of first data fan-out lines, and the second data fan-out line layer includes a plurality of second data fan-out lines. Orthographic projections of the first data fan-out line layer and the second data fan-out line layer on the substrate do not overlap, and a plurality of first data fan-out lines and a plurality of second data fan-out lines are disposed at intervals. In the exemplary embodiments, by arranging a plurality of data fan-out lines in different layers, a distance between adjacent data fan-out lines may be reduced, and transmission interference between adjacent data fan-out lines may be reduced, thereby improving signal transmission performance.

In some exemplary embodiments, a display region at least includes a driving structure layer disposed on a substrate and a light-emitting element disposed on the driving structure layer, wherein the light-emitting element is electrically connected to the driving structure layer. The driving structure layer includes: an active layer, a first gate metal layer, a second gate metal layer, and a source-drain metal layer sequentially disposed on the substrate. A first data fan-out line layer and the first gate metal layer are of the same layer structure, and a second data fan-out line layer and the second gate metal layer are of the same layer structure; a semiconductor structure and the active layer are of the same layer structure; and a conductive connection structure and the source-drain metal layer are of the same layer structure. However, this is not limited in the embodiments.

The display substrate according to the embodiments will be illustrated by some examples below. In the following exemplary embodiments, the display substrate is an OLED display substrate as an example for description. Among them, since a quantity of data lines in a display region and data fan-out lines in a fan-out region are usually large, only part of the data lines and data fan-out lines or a position of the fan-out region are illustrated in the drawings, and the quantity of data lines and data fan-out lines is not limited.

FIG. 1 is a schematic diagram of a display substrate according to at least one embodiment of the present disclosure. As shown in FIG. 1, in this embodiment, the display substrate according to an exemplary embodiment includes a display region 100 and a bezel region located at a periphery of the display region 100. The bezel region includes a first bezel region 200 located on a side of the display region 100 and a second bezel region 300 located at a periphery of the display region 100 and far from the first bezel region 200. The first bezel region 200 and the second bezel region 300 are connected to surround the display region 100. In some examples, the first bezel region 200 is a lower bezel of the display substrate, and the second bezel region 300 includes an upper bezel, a left bezel, and a right bezel of the display substrate. However, this is not limited in the embodiments.

In some exemplary embodiments, as shown in FIG. 1, the display region 100 at least includes a plurality of sub-pixels 1001, a plurality of gate lines (not shown), and a plurality of data lines 1002. Orthogonal projections of a plurality of gate lines and a plurality of data lines 1002 on the substrate intersect to form a plurality of sub-pixel regions, and one sub-pixel 1001 is disposed in each sub-pixel region. The plurality of data lines 1002 are electrically connected to a plurality of sub-pixels 1001, wherein the plurality of data lines 1002 are configured to provide data signals to the plurality of sub-pixels 1001. A plurality of gate lines are electrically connected to the plurality of sub-pixels 1001, and are configured to provide scanning signals to the plurality of sub-pixels 1001. In some examples, a pixel unit may include three sub-pixels, which are respectively a red sub-pixel, a green sub-pixel, and a blue sub-pixel. However, this is not limited in the embodiments. In some examples, a pixel unit may include four sub-pixels, which are respectively a red sub-pixel, a green sub-pixel, a blue sub-pixel, and a white sub-pixel.

In some exemplary embodiments, a shape of a sub-pixel 1001 may be rectangular, diamond, pentagonal, or hexagonal. When a pixel unit includes three sub-pixels, the three sub-pixels may be arranged in a manner to stand side by side horizontally, in a manner to stand side by side vertically, or in a pyramid manner with two units sitting at the bottom and one unit placed on top. When a pixel unit includes four sub-pixels, the four sub-pixels may be arranged in a manner to stand side by side horizontally, in a manner to stand side by side vertically, or in a manner to form a square. However, this is not limited in the embodiments.

In some exemplary embodiments, a second bezel region 300 at least includes a gate driving circuit that provides scanning signals to a plurality of sub-pixels 1001 of a display region 100, and a power supply line (e.g., a low voltage power supply line (VSS)) that transmits voltage signals to the plurality of sub-pixels 1001.

Figure 2:
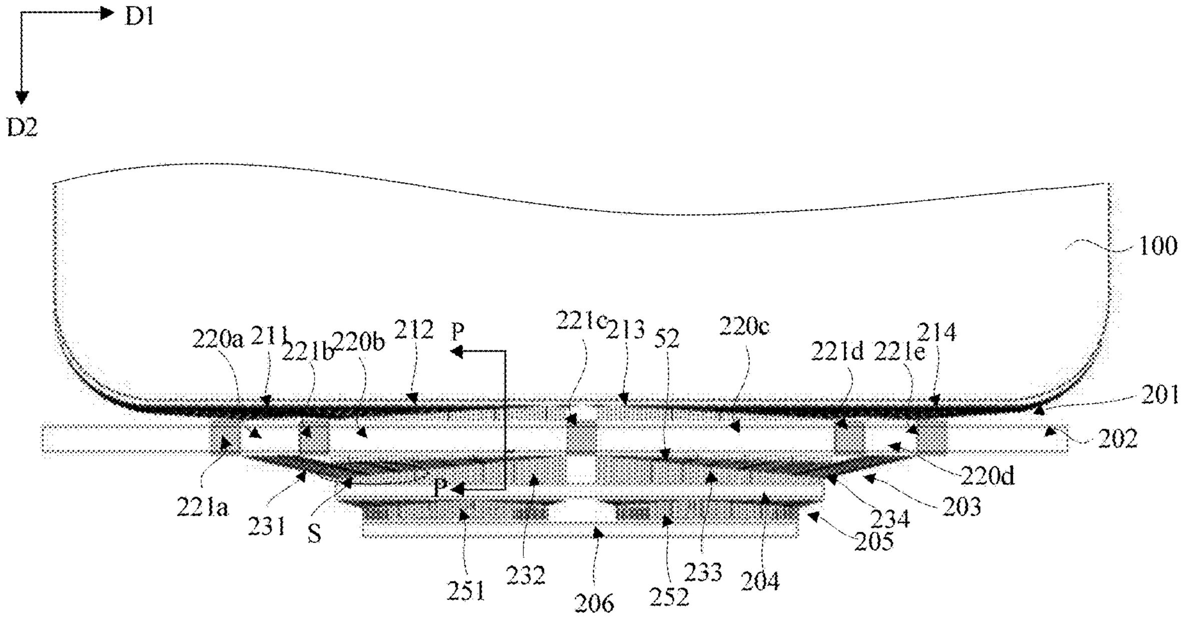
FIG. 2 is a schematic diagram of a first bezel region according to at least one embodiment of the present disclosure.

FIG. 2 is a schematic diagram of a first bezel region according to at least one embodiment of the present disclosure. In some exemplary embodiments, as shown in FIG. 2, a first bezel region 200 includes a first fan-out region 201 located on a side of a display region 100, a bending region 202 located on a side of the first fan-out region 201 away from the display region 100, a second fan-out region 203 located on a side of the bending region 202 away from the display region 100, a test circuit region 204 located on a side of the second fan-out region 203 away from the display region 100, a third fan-out region 205 located on a side of the test circuit region 204 away from the display region 100, and a signal access region 206 located on a side of the third fan-out region 205 away from the display region 100. In this example, fan-out regions in the first bezel region 200 include a first fan-out region 201, a second fan-out region 203, and a third fan-out region 205. The first fan-out region 201 is located between the display region 100 and the bending region 202, the second fan-out region 203 is located between the bending region 202 and the test circuit region 204, and the third fan-out region 205 is located between the test circuit region 204 and the signal access region 206. The first bezel region 200 may further include a binding electrode region (not shown) located on a side of the signal access region 206 away from the display region 100. The bonding electrode region 206 includes a plurality of bonding pads configured to be bonded and connected to an external flexible printed circuit (FPC).

In some exemplary embodiments, as shown in FIG. 2, the first fan-out region 201 is provided with a plurality of first sub-data fan-out lines, a first power supply line (not shown), and a second power supply line (not shown). The plurality of first sub-data fan-out lines are configured to be connected in a one-to-one correspondence with a plurality of data lines of a display region 100 in a fan-out wiring manner. The first power supply line is configured to be connected to a high voltage power supply line (VDD) of the display region 100. The second power supply line is configured to be connected to a low voltage power supply line (VSS) of a second bezel region. In some examples, the first power supply line and the second power supply line are disposed in the same layer, and the first power supply line and the second power supply line are disposed in a different layer from a plurality of first sub-data fan-out lines. Orthographic projections of the plurality of first sub-data fan-out lines on a substrate partially overlap with an orthographic projection of the first power supply line on the substrate, and orthographic projections of the plurality of first sub-data fan-out lines on the substrate partially overlap with an orthographic projection of the second power supply line on the substrate. In some examples, a plurality of first sub-data fan-out lines may be divided into two sets. A plurality of first sub-data fan-out lines of a first set and a plurality of first sub-data fan-out lines of a second set are disposed in different layers. orthographic projections of a plurality of first sub-data fan-out lines of the first set and a plurality of first sub-data fan-out lines of the second set on the substrate do not overlap, and a plurality of first sub-data fan-out lines of the first set and a plurality of first sub-data fan-out lines of the second set are disposed at intervals. However, this is not limited in the embodiments. For example, a plurality of first sub-data fan-out lines in a first fan-out region may be disposed on the same layer.

In some exemplary embodiments, as shown in FIG. 2, the first fan-out region 201 includes a plurality of first fan-out sub-regions, for example, four first fan-out sub-regions 211, 212, 213, and 214 disposed in sequence along a first direction D1. A plurality of first sub-data fan-out lines are disposed in each first fan-out sub-region. Lengths of a plurality of first sub-data fan-out lines in the first fan-out sub-region 211 located on a left edge of the first fan-out region 201 decrease along a direction from an edge of the first fan-out region 201 to middle of the first fan-out region 201. Lengths of a plurality of first sub-data fan-out lines in the first fan-out sub-region 214 located on a right edge of the first fan-out region 201 decrease along a direction from the edge of the first fan-out region 201 to the middle of the first fan-out region 201. Lengths of a plurality of first sub-data fan-out lines in the first fan-out sub-region 212 located on a right side of the fan-out sub-region 211 first decrease and then decrease along a direction from the edge of the first fan-out region 201 to the middle of the first fan-out region 201. Lengths of a plurality of first sub-data fan-out lines in the first fan-out sub-region 213 located on a left side of the fan-out sub-region 214 first decrease and then decrease along a direction from the edge of the first fan-out region 201 to the middle of the first fan-out region 201. However, this is not limited in the embodiments. In some examples, lengths of a plurality of first sub-data fan-out lines in each first fan-out sub-region may decrease along a direction from an edge to middle of a first fan-out region.

In the present disclosure, a first direction D1 is perpendicular to an extension direction of data lines of a display region 100, and a second direction D2 is perpendicular to a first direction D1, that is, the second direction D2 is parallel to the extension direction of the data lines of the display region 100.

In some exemplary embodiments, as shown in FIG. 2, a bending region 202 is configured to bend part of a first bezel region to a back of a display region 100. The bending region 202 is provided with at least a plurality of data connection lines and a plurality of power connection lines. The plurality of data connection lines are configured to be connected to a plurality of first sub-data fan-out lines of the first fan-out region 201 in one-to-one correspondence. The plurality of power connection lines may include a first power connection line (e.g., a high voltage power connection line) and a second power connection line (e.g., a low voltage power connection line); the first power connection line is configured to be connected to the first power supply line of the first fan-out region 201, and the second power connection line is configured to be connected to the second power supply line of the first fan-out region 201. The plurality of data connection lines and the plurality of power connection lines are disposed on the same layer, and power connection lines may be disposed among a plurality of data connection lines.

In some exemplary embodiments, as shown in FIG. 2, a bending region 202 includes a plurality of first bending sub-regions (e.g., four first bending sub-regions 220*a*, 220*b*, 220*c*, and 220*d* sequentially disposed along a first direction D1) and a plurality of second bending sub-regions (e.g., five second bending sub-regions 221*a*, 221*b*, 221*c*, 221*d*, and 221*e* sequentially disposed along the first direction D1). At least one second bending sub-region is provided between two adjacent first bending sub-regions. Each first bending sub-region is provided with a plurality of data connection lines, and each second bending sub-region is provided with a power connection line. For example, the second bending sub-regions 221*a* and 221*e* are provided with second power connection lines, and the second bending sub-regions 221*b*, 221*c*, and 221*d* are provided with first power connection lines. In this example, the second bending sub-region 221*b* is located between the first bending sub-regions 220*a* and 220*b*, the second bending sub-region 221*c* is located between the first bending sub-regions 220*b* and 220*c*, and the second bending sub-region 221*d* is located between the first bending sub-regions 220*c* and 220*d*. A plurality of first fan-out sub-regions of the first fan-out region 201 correspond to a plurality of first bending sub-regions of the bending region 202 in one-to-one correspondence. A plurality of first sub-data fan-out lines in a first fan-out sub-region are connected to a plurality of data connection lines in a corresponding first bending sub-region in one-to-one correspondence.

In some exemplary embodiments, as shown in FIG. 2, a second fan-out region 203 is provided with a plurality of second sub-data fan-out lines. The plurality of second sub-data fan-out lines are configured to be connected to a plurality of data connection lines of a bending region 202 in a fan-out wiring manner, and the plurality of second sub-data fan-out lines are connected to the plurality of data connection lines of the bending region 202 in one-to-one correspondence. In some examples, a plurality of second sub-data fan-out lines may be divided into two sets. A plurality of second sub-data fan-out lines of a first set and a plurality of second sub-data fan-out lines of a second set are disposed in different layers. Orthographic projections of a plurality of second sub-data fan-out lines of the first set and a plurality of second sub-data fan-out lines of the second set on a substrate do not overlap, and the plurality of second sub-data fan-out lines of the first set and the plurality of second sub-data fan-out lines of the second set are disposed at intervals. A plurality of second sub-data fan-out lines of a first set of a second fan-out region 203 may be disposed in the same layer as a plurality of first sub-data fan-out lines of a first set of a first fan-out region 201, and a plurality of second sub-data fan-out lines of a second set of the second fan-out region 203 may be disposed in the same layer as a plurality of first sub-data fan-out lines of a second set of the first fan-out region 201. However, this is not limited in the embodiments.

In some exemplary embodiments, as shown in FIG. 2, a second fan-out region 203 includes a plurality of second fan-out sub-regions, for example, four second fan-out sub-regions 231, 232, 233, and 234 disposed in sequence along a first direction D1. A plurality of second sub-data fan-out lines are disposed in each second fan-out sub-region. Lengths of a plurality of second sub-data fan-out lines in each second fan-out sub-region decrease along a direction from an edge of the second fan-out region 203 to middle of the second fan-out region 203. The plurality of second fan-out sub-regions of the second fan-out region 203 correspond to a plurality of first bending sub-regions of a bending region 202 in one-to-one correspondence. A plurality of second sub-data fan-out lines in a second fan-out sub-region are connected to a plurality of data connection lines in a corresponding first bending sub-region in one-to-one correspondence. In other words, a plurality of first sub-data fan-out lines of a first fan-out region 201 are connected to a plurality of second sub-data fan-out lines of a second fan-out region 203 in a one-to-one correspondence through a plurality of data connection lines of a first bending sub-region. In this example, a quantity of second fan-out sub-regions corresponds to a quantity of first fan-out sub-regions. However, this is not limited in the embodiments.

In some exemplary embodiments, as shown in FIG. 2, a test circuit region 204 includes a test circuit including a plurality of test units, each of which is connected to a plurality of second sub-data fan-out lines of a second fan-out region 203. Each test unit may provide test data signals to a plurality of data lines of a display region 100 through a second sub-data fan-out line, a data connection line, and a first sub-data fan-out line which are sequentially connected. In some examples, a test circuit may include at least one test control signal line, a plurality of test data signal lines, and a plurality of test units, each test unit is connected to a test control signal line and a test data signal line, and is connected to a plurality of data lines of a display region. A test unit is configured to, according to control of a test control signal line, provide (simultaneously or respectively) signals (test data signals) of a test data signal line to a plurality of data lines of a display region connected to it to detect and locate defective sub-pixels in the display region. However, a structure of a test circuit is not limited in the embodiments.

In some exemplary embodiments, as shown in FIG. 2, a third fan-out region 205 includes a plurality of third fan-out sub-regions, for example, two third fan-out sub-regions 233 and 234 disposed in sequence along a first direction D1. Each third fan-out sub-region is provided with a plurality of third sub-data fan-out lines, which are configured to be connected to a signal input pad of a signal access region 206 in a fan-out wiring manner. Lengths of a plurality of third sub-data fan-out lines in each third fan-out sub-region may first decrease and then increase along a direction from an edge of a third fan-out region 203 to middle of the third fan-out region 203. In this example, one third fan-out sub-region corresponds to two second fan-out sub-regions. A plurality of third sub-data fan-out lines in a third fan-out sub-region may be connected to a plurality of second sub-data fan-out lines in two adjacent second fan-out sub-regions of a second fan-out region in a one-to-one correspondence. That is, a quantity of third sub-data fan-out lines in a third fan-out region and a quantity of second sub-data fan-out lines in a second fan-out region are the same and the third sub-data fan-out lines in the third fan-out region and the second sub-data fan-out lines in the second fan-out region may be connected in one-to-one correspondence. However, this is not limited in the embodiments. In some examples, the quantity of the third sub-data fan-out lines in the third fan-out region and the quantity of the second sub-data fan-out lines in the second fan-out region may have a 1:N relationship, where N is an integer greater than 1.

In some examples, a plurality of third sub-data fan-out lines in a third fan-out region 205 may be divided into two sets. A plurality of third sub-data fan-out lines of a first set and a plurality of third sub-data fan-out lines of a second set are disposed in different layers. Orthographic projections a plurality of third sub-data fan-out lines of the first set and a plurality of third sub-data fan-out lines of the second set on a substrate do not overlap, and the plurality of third sub-data fan-out lines of the first set and the plurality of second set of third sub-data fan-out lines of the second set are disposed at intervals. A plurality of third sub-data fan-out lines of a first set in a third fan-out region 205 may be disposed in the same layer as a plurality of second sub-data fan-out lines of a first set in a second fan-out region 203, and a plurality of second set of third sub-data fan-out lines of a second set in the third fan-out region 205 may be disposed in the same layer as a plurality of second set of second sub-data fan-out lines of a second set in the second fan-out region 203. However, this is not limited in the embodiments.

In some exemplary embodiments, as shown in FIG. 2, a signal access region 206 includes a plurality of signal input pads configured to be connected to a driving integrated circuit (IC). The driving integrated circuit may be connected to a plurality of third sub-data fan-out lines of a third fan-out region 205 through a plurality of signal input pads, and be configured to provide data signals to a plurality of data lines of a display region 100.

In some exemplary embodiments, as shown in FIG. 2, a fan-out region of a first bezel region includes a first fan-out region 201, a second fan-out region 203, and a third fan-out region 205. Data fan-out lines connecting data lines of a display region 100 and signal input pads of a signal access region 206 in a fan-out region include a first sub-data fan-out line located in a first fan-out region 201, a second sub-data fan-out line located in a second fan-out region 203 and electrically connected to the first sub-data fan-out line, and a third sub-data fan-out line located in a third fan-out region 205 and electrically connected to the second sub-data fan-out line. All data lines in the display region 100 may be connected in parallel to a driving integrated circuit connected to a signal access region 206 through data fan-out lines and data connection lines in a bending region 202, and the driving integrated circuit controls these data lines to provide data signals for display to sub-pixels in the display region 100. In this example, a plurality of data fan-out lines are arranged in different layers, which may reduce a distance between adjacent data fan-out lines as well as a transmission interference of adjacent data fan-out lines, thereby improving signal transmission performance.

Figure 3:
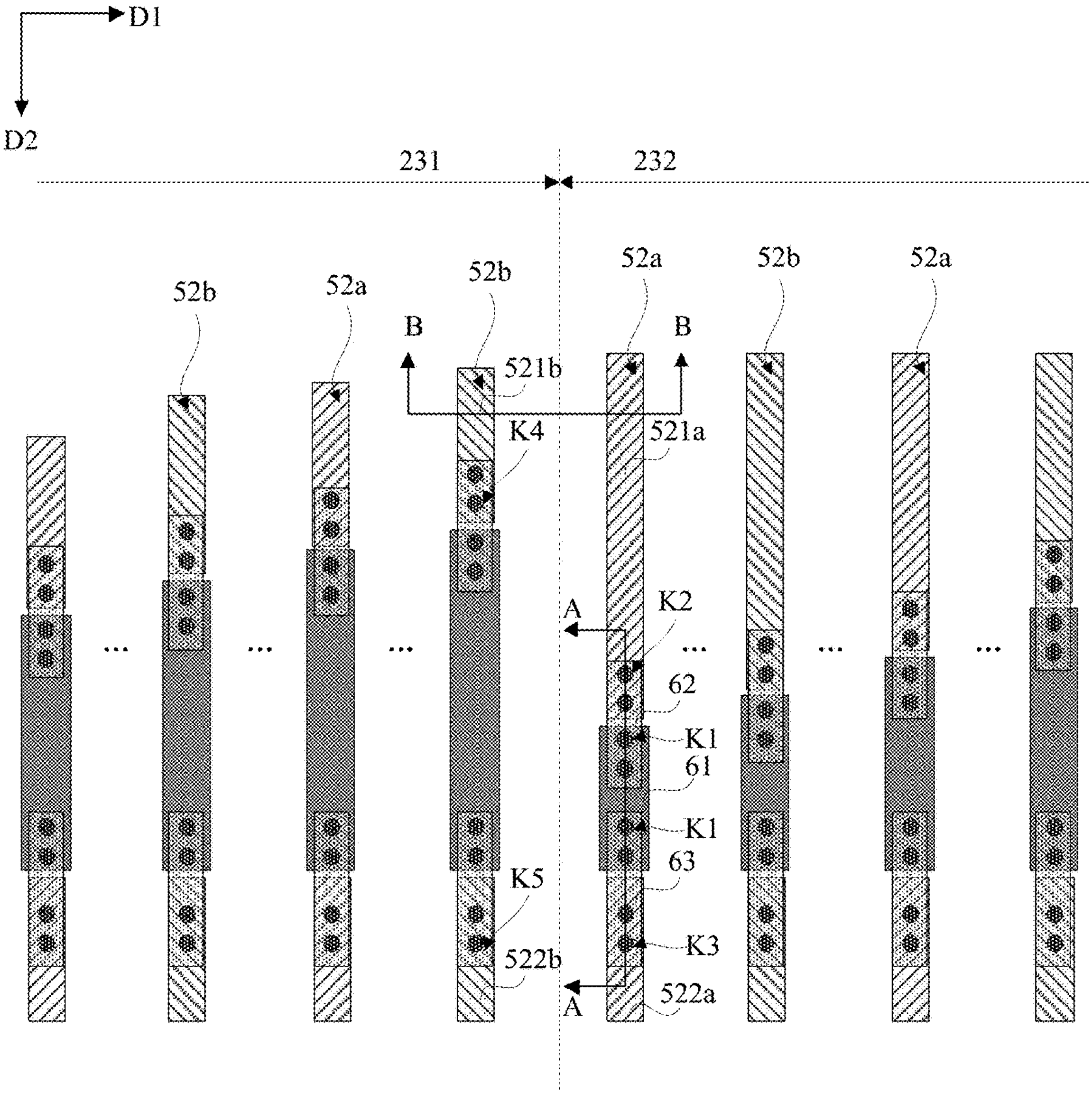
FIG. 3 is a partial enlarged schematic diagram of a region S in FIG. 2.
Figure 4:
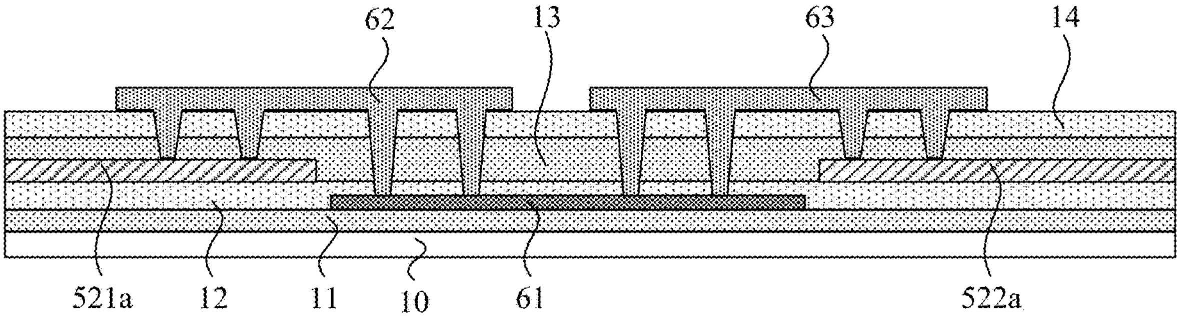
FIG. 4 is a schematic sectional view along an A-A direction in FIG. 3.
Figure 5:
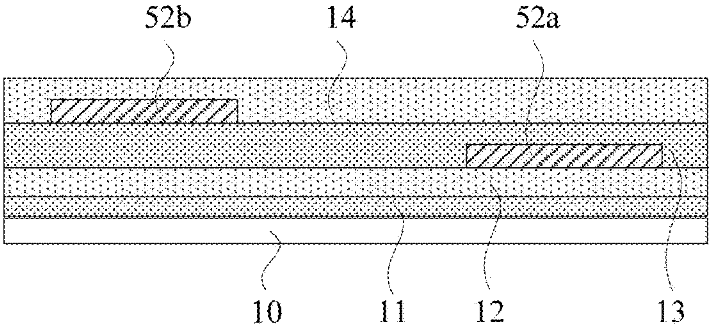
FIG. 5 is a schematic sectional view along a B-B direction in FIG. 3.

FIG. 3 is a partial enlarged schematic diagram of a region S in FIG. 2, FIG. 4 is a schematic sectional view along an A-A direction in FIG. 3, and FIG. 5 is a schematic sectional view along a B-B direction in FIG. 3. In FIG. 3, structures of a plurality of second sub-data fan-out lines and resistance compensation units are enlarged for illustrating differences of resistance compensation units connected to different second sub-data fan-out lines.

In some exemplary embodiments, a plurality of second sub-data fan-out lines of a second fan-out region 203 are divided into two sets. As shown in FIG. 3, in a plane parallel to a display substrate, a plurality of second sub-data fan-out lines 52*a* of a first set and a plurality of second sub-data fan-out lines 52*b* of a second set are disposed at intervals. As shown in FIG. 5, in a plane perpendicular to a display substrate, second sub-data fan-out lines 52*b* of a second set are located on a side of second sub-data fan-out lines 52*a* of a first set away from a substrate 10, and a third insulating layer 13 is provided between the second sub-data fan-out lines 52*b* of the second set and the second sub-data fan-out lines 52*a* of the first set. In this example, by arranging a plurality of second sub-data fan-out lines in different layers, a distance between adjacent second sub-data fan-out lines may be reduced, and a transmission interference of adjacent second sub-data fan-out lines may be reduced, thereby improving signal transmission performance. However, this is not limited in the embodiments. For example, a plurality of second sub-data fan-out lines in a second fan-out region may be disposed in the same layer.

In some exemplary embodiments, as shown in FIG. 3, the second fan-out region 203 is further provided with a plurality of resistance compensation units. A plurality of second sub-data fan-out lines of the second fan-out region 203 are connected in series with and electrically connected to a plurality of resistance compensation units in one-to-one correspondence. That is, a second sub-data fan-out line is connected in series with and electrically connected to a resistance compensation unit. A plurality of resistance compensation units may be sequentially disposed in the second fan-out region 203 along a first direction D1. In the exemplary embodiments, by connecting a second sub-data fan-out line in a second fan-out region in series and electrically connecting a resistance compensation unit, resistance compensation may be performed on an entire data fan-out line in an entire fan-out region. However, this is not limited in the embodiments. For example, a resistance compensation unit may be disposed in a first fan-out region and connected in series with and electrically connected to a first sub-data fan-out line, or may be disposed in a third fan-out region and connected in series with and electrically connected to a third sub-data fan-out line.

In some exemplary embodiments, as shown in FIGS. 3 and 4, at least one resistance compensation unit includes a semiconductor structure 61 and a conductive connection structure sequentially disposed on a substrate 10. The conductive connection structure includes a first connection electrode 62 and a second connection electrode 63. The first connection electrode 62 is electrically connected to one terminal of the semiconductor structure 61 through two first vias K1, and the second connection electrode 63 is electrically connected to the other terminal of the semiconductor structure 61 through two first vias K1. The first vias K1 may be circular, elliptical, or rectangular. However, a quantity and shapes of the first vias are not limited in the embodiments.

In some exemplary embodiments, as shown in FIG. 3, second sub-data fan-out line 52*a* includes a first part 521*a* and a second part 522*a* that are disconnected. A resistance compensation unit is connected in series between the first part 521*a* and the second part 522*a* of the second sub-data fan-out line 52*a*. The first part 521*a* of the second sub-data fan-out line 52*a* is electrically connected to a first connection electrode 62 of a resistance compensation unit through two second vias K2, and the second part 522*a* of the second sub-data fan-out line 52*a* is electrically connected to a second connection electrode 63 of the resistance compensation unit through two third vias K3. The second sub-data fan-out line 52*b* includes a first part 521*b* and a second part 522*b* that are disconnected. A resistance compensation unit is connected in series between the first part 521*b* and the second part 522*b* of the second sub-data fan-out line 52*b*. The first part 521*b* of the second sub-data fan-out line 52*b* is electrically connected to a first connection electrode of a resistance compensation unit through two fourth vias K4, and the second part 522*b* of the second sub-data fan-out line 52*b* is electrically connected to a second connection electrode of the resistance compensation unit through two fifth vias K5. The second vias K2, the third vias K3, the fourth vias K4, and the fifth vias K5 may be circular, elliptical, or rectangular. However, quantities and shapes of the second vias K2, the third vias K3, the fourth vias K4, and the fifth vias K5 are not limited in the embodiments.

In some examples, as shown in FIG. 3, shapes and sizes of a plurality of first connection electrodes 62 and a plurality of second connection electrodes 63 may be the same, for example, are all rectangular (e.g., rounded rectangle). Shapes of a plurality of semiconductor structures 61 may be the same, for example, are all rectangular. Areas of a plurality of semiconductor structures 61 may be different, for example, lengths of a plurality of semiconductor structures 61 along a first direction D1 may be the same, and lengths of the plurality of semiconductor structures 61 along a second direction D2 may be different. However, this is not limited in the embodiments.

In some exemplary embodiments, as shown in FIGS. 3 to 5, in a plane perpendicular to a display substrate, a second fan-out region 203 includes a semiconductor structure 61, a first data fan-out line layer, a second data fan-out line layer, and a conductive connection structure sequentially disposed on a substrate 10. The first data fan-out line layer of the second fan-out region 203 includes a plurality of second sub-data fan-out lines 52*a*, and a second data fan-out line layer includes a plurality of second sub-data fan-out lines 52*b*. The conductive connection structure includes a first connection electrode 62 and a second connection electrode 63. The semiconductor structure 61 is located on a side of the second sub-data fan-out lines 52*a* and 52*b* near the substrate 10, and the first connection electrode 62 and the second connection electrode 63 are located on a side of the second sub-data fan-out lines 52*a* and 52*b* away from the substrate 10. A second insulating layer 12 is provided between the semiconductor structure 61 and the first data fan-out line layer, a third insulating layer 13 is provided between the first data fan-out line layer and the second data fan-out line layer, and a fourth insulating layer 14 is provided between the second data fan-out line layer and the conductive connection structure. A first via K1 is provided on the fourth insulating layer 14 and exposes a surface of the semiconductor structure 61, a second via K2 and a third via K3 are provided on the fourth insulating layer 14 and expose a surface of the first data fan-out line layer, and a fourth via K4 and a fifth via K5 are disposed on the fourth insulating layer 14 and expose a surface of the second data fan-out line layer. In this example, a semiconductor structure achieves a jumper connection with a first data fan-out line layer and a second data fan-out line layer through a first connection electrode and a second connection electrode.

Figure 6:
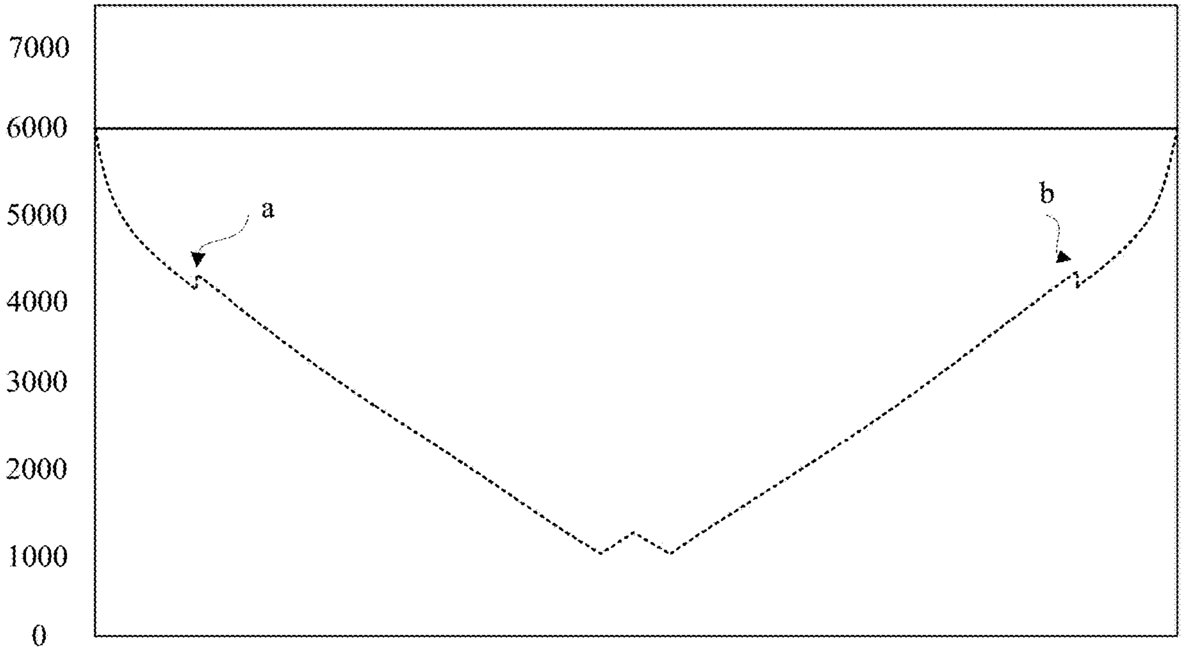
FIG. 6 is a schematic diagram of resistance distribution curves before and after resistance compensation is performed on data fan-out lines of a display substrate according to at least one embodiment of the present disclosure.

FIG. 6 is a schematic diagram of resistance distribution curves before and after resistance compensation is performed on data fan-out lines of a display substrate according to at least one embodiment of the present disclosure. As shown in FIG. 6, an abscissa indicates a sequence of a plurality of data fan-out lines from a left edge to a right edge along a first direction D1 in a first bezel region in FIG. 2; an ordinate indicates resistance values in ohms. A dotted line in FIG. 6 indicates resistance values of data fan-out lines from the left edge to the right edge along the first direction D1 before a resistance compensation unit is provided, and a solid line indicates resistance values of the data fan-out lines after the resistance compensation unit is provided. A difference between a resistance value of the solid line and that of the dotted line corresponding to an abscissa position in FIG. 6 is a compensation resistance value provided by the resistance compensation unit connected in series with a data fan-out line corresponding to the abscissa position.

As shown in FIG. 6, before resistance compensation is not performed on data fan-out lines in a first bezel region, since data fan-out lines are arranged in a fan-out wiring manner in a fan-out region, and display substrates all have rounded corners at present, relative positions between a plurality of data fan-out lines and a signal access region are different, and thus a length of each data fan-out line is different. For example, in FIG. 2, lengths of data fan-out lines located on both edges along a first direction D1 are longer, and lengths decrease and then increase along a direction from an edge to a middle region. Since a plurality of data fan-out lines are usually made of the same conductive material (i.e., the same resistivity) and formed under the same or similar patterning process, line widths and thicknesses of the plurality of data fan-out lines are correspondingly equal (or very close). Therefore, resistance values of the plurality of data fan-out lines increases as their lengths increase. Due to a length difference between different data fan-out lines, there is a large resistance difference between a plurality of data fan-out lines. And the greater the length difference between different data fan-out lines, the greater the resistance difference, which leads to color deviation and uneven brightness (Mura) in a display screen of a display region, affecting a display effect. In addition, since power connection lines and data connection lines are disposed in the same layer in a bending region, and the power connection lines are disposed in middle of the data connection lines, data fan-out lines connected to data connection lines on both sides of a second bending sub-region where the power connection lines are located will have a length jump, resulting in a jump in resistance values, which in turn leads to a block-shaped poor display (Mura). That is, the display region is bounded by two adjacent rows of sub-pixels connected by data fan-out lines on both sides of the second bending sub-region, and there is an obvious brightness difference on both sides of the boundary. For example, a first resistance trip point a in FIG. 6 is generated by data fan-out lines on both sides of a second bending region 221*b* in FIG. 2, and a second resistance trip point b is generated by data fan-out lines on both sides of a second bending region 221*d* in FIG. 2.

In some exemplary embodiments, as shown in FIG. 6, after data fan-out lines are connected in series with a resistance compensation unit, resistance values of a plurality of data fan-out lines in a first bezel region may be basically the same, thereby improving display color deviation or uneven brightness caused by resistance value differences of data fan-out lines in a display region and enhancing a display effect. In the exemplary embodiments, an area of a semiconductor structure of a resistance compensation unit is proportional to a resistance value provided by the resistance compensation unit, that is, the larger the area of the semiconductor structure, the larger the resistance value for compensation, and the smaller the area of the semiconductor structure, the smaller the resistance value for compensation. A compensation resistance value can be adjusted by adjusting an area of a semiconductor structure. Moreover, a resistance value of a semiconductor structure is about 4000 Ω/um^2, which may compensate an enough resistance difference in a limited space and achieve resistance compensation at a kilo-ohm level in a narrow space.

In some exemplary embodiments, a total area of a semiconductor structure of a resistance compensation unit connected in series with a data fan-out line with a smaller resistance value is larger than a total area of a semiconductor structure of a resistance compensation unit connected in series with a data fan-out line with a larger resistance value. As shown in FIG. 2 and FIG. 3, due to existence of a second bending sub-region 221*b*, there will be a length jump between second sub-data fan-out lines 52*b* and 52*a* at a boundary of second fan-out sub-regions 231 and 232. For example, lengths of second sub-data fan-out lines in the second fan-out region 231 is decreasing along a direction from an edge of a second fan-out region 203 to middle of a second fan-out region 203, and lengths of second sub-data fan-out lines in the second fan-out region 232 is also decreasing along the direction from the edge of a second fan-out region 203 to the middle of the second fan-out region 203. However, at a junction of the second fan-out sub-regions 231 and 232, a length of a second sub-data fan-out line 52*a* in the second fan-out sub-region 232 is greater than a length of a second sub-data fan-out line 52*b* in the adjacent second fan-out sub-region 231. As shown in FIG. 3, in order to compensate resistance values of the second sub-data fan-out lines 52*a* and 52*b* at the junction of the second fan-out sub-regions 231 and 232, a resistance compensation unit is connected in series to the second sub-data fan-out lines 52*a* and 52*b* respectively, and an area of a semiconductor structure 61 of a resistance compensation unit connected in series with the second sub-data fan-out line 52*a* is smaller than an area of a semiconductor structure 61 of a resistance compensation unit connected in series with the second sub-data fan-out line 52*b*. In this example, lengths of a plurality of semiconductor structures along a first direction D1 may be the same, and an area of a semiconductor structure is changed by adjusting a length of the semiconductor structure along a second direction D2. For example, a length of a semiconductor structure along the second direction D2 may vary on an order of microns. In some examples, as shown in FIG. 2, FIG. 3, and FIG. 6, lengths of semiconductor structures connected in series with a plurality of second sub-data fan-out lines in a second fan-out region 231 along a second direction D2 may increase from an edge of a second fan-out region 203 to middle of the second fan-out region 203, and lengths of semiconductor structures connected in series with a plurality of second sub-data fan-out lines in a second fan-out region 232 along the second direction D2 may increase first and then decrease from the edge of the second fan-out region 203 to the middle of the second fan-out region 203.

Figure 7:
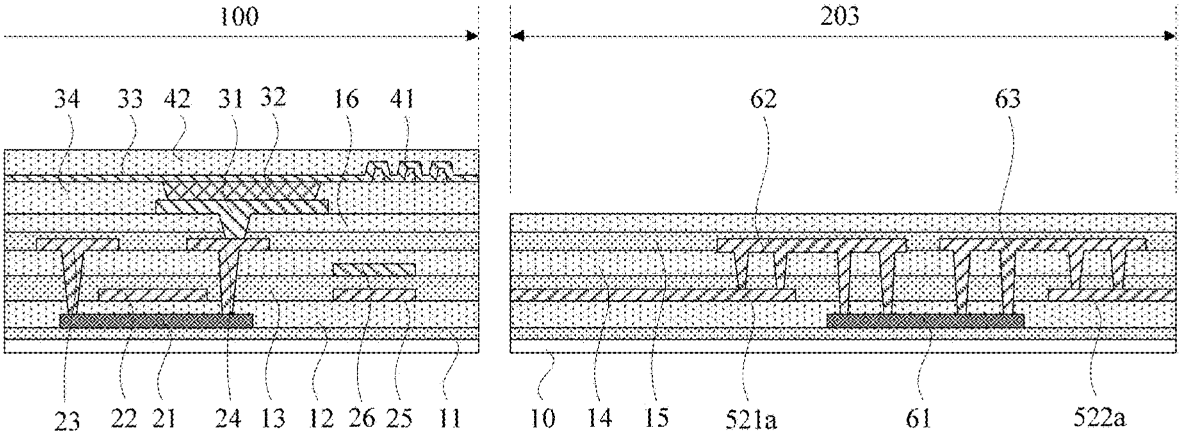
FIG. 7 is a schematic sectional view along a P-P direction in FIG. 2.

FIG. 7 is a partial schematic sectional view along a P-P direction in FIG. 2. In reference to FIG. 7, a structure of a display substrate according to the present disclosure is described below by an example of a preparation process of a display substrate. A "patterning process" mentioned in the present disclosure includes processes, such as film layer deposition, photoresist coating, mask exposure, development, etching, and photoresist stripping. The deposition may be selected as any one or more of sputtering, evaporation, and chemical vapor deposition, the coating may be selected as any one or more of spraying and spin coating, and the etching may be selected as any one or more of dry etching and wet etching. A "thin film" refers to a layer of thin film manufactured by deposition or coating of a certain material on a substrate. If the "thin film" does not need a patterning process during a whole manufacturing process, the "thin film" may also be called a "layer". When the "thin film" needs a patterning process during a whole manufacturing process, it is called a "thin film" before the patterning process and as a "layer" after the patterning process. The "layer" after the patterning process contains at least one "pattern".

In the present disclosure, "A and B are disposed on the same layer" means that A and B are formed at the same time by the same patterning process. The "same layer" does not always mean that a thickness or a height of the layer are the same in a sectional view. "An orthographic projection of A contains an orthographic projection of B" means that the orthographic projection of B falls within a scope of the orthographic projection of A, or the orthographic projection of A covers the orthographic projection of B.

In some exemplary embodiments, a preparation process of a display substrate of the embodiments may include following acts (1) to (8).

(1) Preparing a flexible substrate on a glass carrier plate.

In some exemplary embodiments, a substrate 10 may include a first flexible material layer, a first inorganic material layer, a semiconductor layer, a second flexible material layer, and a second inorganic material layer which are stacked on a glass carrier plate. Materials of the first and second flexible material layers may be materials such as polyimide (PI), polyethylene terephthalate (PET), or a surface-treated polymer soft thin film. Materials of the first inorganic material layer and the second inorganic material layer may be materials such as silicon nitride (SiNx) or silicon oxide (SiOx), which is used to improve water and oxygen resistance of the substrate. The first inorganic material layer and the second inorganic material layer may be called barrier layers. A material of the semiconductor layer may be amorphous silicon (a-si).

In some exemplary embodiments, a preparation process of a substrate may include: coating a layer of polyimide on a glass carrier plate, and forming a first flexible (PI1) material layer after curing the layer of polyimide to form a thin film; subsequently, depositing a layer of barrier thin film on the first flexible material layer to form a first barrier (Barrier 1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible (PI2) material layer after curing the layer of polyimide to form a thin film; then depositing a layer of barrier thin film on the second flexible material layer to form a second barrier (Barrier 2) layer covering the second flexible layer, to complete preparation of the substrate 10. After this process, a display region and a first bezel region all include the substrate 10.

(2) Preparing an active layer pattern and a semiconductor structure pattern on the substrate.

In some exemplary embodiments, a first insulating film and a semiconductor layer thin film are sequentially deposited on a substrate 10, and the semiconductor layer thin film is patterned through a patterning process to form a first insulating layer 11 covering the entire substrate 10, and an active layer pattern and a semiconductor structure pattern disposed on the first insulating layer 11. As shown in FIG. 7, an active layer pattern is formed in a display region 100 and at least includes a first active layer 21. A semiconductor structure pattern is formed in a second fan-out region 203 and at least includes a semiconductor structure 61.

(3) Preparing a first gate metal layer pattern and a first data fan-out line layer pattern on the substrate.

In some exemplary embodiments, a second insulating thin film and a first metal thin film are sequentially deposited on the substrate 10 with the aforementioned structure, and the first metal thin film is patterned through a patterning process to form a second insulating layer 12 covering an active layer pattern and a semiconductor structure pattern, and a first gate metal layer pattern and a first data fan-out line layer pattern disposed on the second insulating layer 12. As shown in FIG. 7, a first gate metal layer pattern is formed in a display region 100 and at least includes a first gate electrode 22, a first capacitor electrode 25, and a plurality of gate lines (not shown). A first data fan-out line layer pattern is formed in a fan-out region and at least includes a plurality of first data fan-out lines. A first data fan-out line includes a first sub-data fan-out line located in a first fan-out region, a second sub-data fan-out line located in a second fan-out region and electrically connected to a first sub-data fan-out line in the same layer (for example, a second sub-data fan-out line 52*a* shown in FIG. 3 includes a first part 521*a* and a second part 522*a* that are disconnected), and a third sub-data fan-out line located in a third fan-out region and electrically connected to a second sub-data fan-out line in the same layer. A first sub-data fan-out line is configured to be electrically connected to a data line formed subsequently in a display region 100. A first sub-data fan-out line and a second sub-data fan-out line are configured to be electrically connected through a data connection line subsequently formed in a bending region.

(4) Preparing a second gate metal layer pattern and a second data fan-out line layer pattern on the substrate.

In some exemplary embodiments, a third insulating thin film and a second metal thin film are sequentially deposited on the substrate 10 with the aforementioned structure, and the second metal thin film is patterned through a patterning process to form a third insulating layer 13 covering a first gate metal layer patter, a first data fan-out line layer pattern, and a second insulating layer 12, and a second gate metal layer pattern and a second data fan-out line layer pattern disposed on the third insulating layer 13. As shown in FIG. 7, a second gate metal layer pattern is formed in a display region 100 and at least includes a second capacitor electrode 26. A second data fan-out line layer pattern is formed in a fan-out region and at least includes a plurality of second data fan-out lines. A second data fan-out line includes a first sub-data fan-out line located in a first fan-out region, a second sub-data fan-out line located in a second fan-out region and electrically connected to a first sub-data fan-out line in the same layer (for example, a second sub-data fan-out line 52*b* shown in FIG. 3), and a third sub-data fan-out line located in a third fan-out region and electrically connected to a second sub-data fan-out line in the same layer. A first sub-data fan-out line of a second data fan-out line layer is configured to be electrically connected to a data line formed subsequently in a display region 100. A first sub-data fan-out line and a second sub-data fan-out line in the same layer are configured to be electrically connected through a data connection line subsequently formed in a bending region.

(5) Preparing a fourth insulating layer pattern on the substrate.

In some exemplary embodiments, a fourth insulating thin film is deposited on the substrate 10 with the aforementioned structure, and the fourth insulating thin film is patterned through a patterning process to form a fourth insulating film layer 14 pattern covering a second gate metal layer and a second data fan-out line layer pattern. As shown in FIGS. 3 and 7, a fourth insulating layer is provided with at least a plurality of first vias K1, a plurality of second vias K2, a plurality of third vias K3, a plurality of fourth vias K4, a plurality of fifth via K5, and a plurality of sixth vias. The plurality of first vias K1, the plurality of second vias K2, the plurality of third vias K3, the plurality of fourth vias K4, and the plurality of fifth vias K5 are located in a second fan-out region 203. The plurality of first vias K1 expose a surface of a semiconductor structure 61, the plurality of second vias K2 and the plurality of third vias K3 expose a surface of a second sub-data fan-out line located in a first data fan-out line layer, and the plurality of fourth vias K4 and the plurality of fifth vias K5 expose a surface of a second sub-data fan-out line located in a second data fan-out line layer. The plurality of sixth vias are located in a display region 100 and expose a surface of a first active layer 21.

In some exemplary embodiments, after a fourth insulating layer 14 is formed, a bending region is trenched by a first Etch Bending A MASK (EBA MASK) and a second Etch Bending B MASK (EBB MASK) to reduce a thickness of the bending region and improve a bending effect.

(6) Preparing patterns of a source-drain metal layer, a conductive connection structure, a data connection line, and a power connection line on the substrate.

In some exemplary embodiments, a third metal thin film is deposited on the substrate 10 with the aforementioned structure, and a third metal thin film is patterned through a patterning process to form a source-drain metal layer pattern, a conductive connection structure pattern, a data connection line pattern, and a power connection line pattern on a fourth insulating layer 14. As shown in FIG. 7, a source-drain metal layer pattern is formed in a display region 100, and at least includes a first source electrode 23, a first drain electrode 24, a plurality of data lines (not shown), and power supply lines (for example, VDD and VSS) patterns. The first source electrode 23 and the first drain electrode 24 are connected to a first active layer 21 through sixth vias, respectively. As shown in FIGS. 3 and 7, a conductive connection structure pattern is formed in a second fan-out region 203, and at least includes a first connection electrode 62 and a second connection electrode 63. One terminal of the first connection electrode 62 is connected to a first part 521*a* of a second sub-data fan-out line 52*a* through two second vias K2, and the other terminal of the first connection electrode 62 is connected to a semiconductor structure 61 through two first vias K1. One terminal of the second connection electrode 63 is connected to a second part 522*a* of the second sub-data fan-out line 52*a* through two third vias K3, and the other terminal of the second connection electrode 63 is connected to the semiconductor structure 61 through two first vias K1. A data connection line and a power connection line are formed in a bending region, and the power connection line is disposed in middle of data connection lines. Two terminals of at least one data connection line are respectively connected to a first sub-data fan-out line and a second sub-data fan-out line of a first data fan-out line layer, or respectively connected to a first sub-data fan-out line and a second sub-data fan-out line of a second data fan-out line layer.

So far, a driving structure layer of a display region 100 is prepared on a substrate 10, as shown in FIG. 7. In the driving structure layer of the display region 100, a first active layer 21, a first gate electrode 22, a first source electrode 23, and a first drain electrode 24 constitute a first transistor, and a first capacitor electrode 25 and a second capacitor electrode 26 constitute a first storage capacitor.

In some exemplary embodiments, a first insulating layer 11 may be referred to as a buffer layer, second and third insulating layers 12 and 13 may be referred to as gate insulating layers, and a fourth insulating layer 14 may be referred to as an interlayer insulating layer. The first insulating layer 11, the second insulating layer 12, the third insulating layer 13, and the fourth insulating layer 14 may be made of any one or more of silicon oxide (SiOx), silicon nitride (SiNx), and silicon oxynitride (SiON), and may be a single layer, a a plurality of layer, or a composite layer. The first insulating layer 11 may be used to improve water and oxygen resistance of the substrate 10. The first metal thin film, the second metal thin film, and the third metal thin film may be made of metal materials, such as any one or more of silver (Ag), copper (Cu), aluminum (Al), titanium (Ti), and molybdenum (Mo), or alloy materials of the aforementioned metals, such as an aluminum neodymium (AlNd) alloy or a molybdenum niobium (MoNb) alloy, and may be a single-layer structure or a multilayer composite structure, such as Ti/Al/Ti. A semiconductor layer thin film may be made of one of more materials such as amorphous indium gallium zinc oxide material (a-IGZO), zinc oxynitride (ZnON), indium zinc tin oxide (IZTO), amorphous silicon (a-Si), polysilicon (p-Si), hexathiophene, or polythiophene. That is, the present disclosure is applicable to transistors that are manufactured based on an oxid technology, a silicon technology, and an organic technology.

(7) Preparing a fifth insulating layer and a planarization (PLN) layer on the substrate.

In some exemplary embodiments, a fifth insulating thin film is deposited on the substrate 10 formed with the aforementioned structure, and a fifth insulating layer 15 is formed through a patterning process. Then, a planarization thin film is coated on the substrate 10 formed with the aforementioned structure to form a planarization layer 16 covering the entire substrate 10, and a seventh via is formed on the planarization layer 16 through a patterning process. A plurality of seventh vias are formed in a display region 100, and the planarization layer 16 and the fifth insulating layer 15 in any seventh via are etched away, exposing a surface of a first drain electrode 24 of a first transistor.

(8) Sequentially preparing an anode, a pixel definition layer, a pillar spacer, an organic light-emitting layer, a cathode, and an encapsulation layer on the substrate.

In some exemplary embodiments, a transparent conductive thin film is deposited on the substrate 10 formed with the aforementioned structure, and the transparent conductive thin film is patterned through a patterning process to form an anode 31 pattern. As shown in FIG. 7, an anode 31 pattern is formed on a planarization layer 16 of a display region 100 and connected to a first drain electrode 24 through a seventh via.

In some exemplary embodiments, a pixel definition film is coated on the substrate 10 formed with the aforementioned structure, and a pixel definition layer (PDL) 34 pattern is formed through masking, exposure, and development processes. As shown in FIG. 7, a pixel definition layer 34 is formed in a display region 100 and a second fan-out region 203. The pixel definition layer 34 of the display region 100 is provided with a pixel opening, and a pixel definition thin film in the pixel opening is developed to expose a surface of an anode 31.

In some exemplary embodiments, an organic material film is coated on the substrate 10 on which the aforementioned patterns are formed, and a pillar spacer (PS) layer 41 pattern is formed in a display region 100 through masking, exposure, and development processes. As shown in FIG. 7, a pillar spacer layer 41 of a display region 100 includes a plurality of pillar spacers.

In some exemplary embodiments, an organic light-emitting layer 32 and a cathode 33 are sequentially formed on the substrate 10 on which the aforementioned patterns are formed. As shown in FIG. 7, an organic light-emitting layer 32 includes a hole injection layer, a hole transmission layer, a light-emitting layer, an electron transmission layer, and an electron injection layer which are stacked, and is formed in a pixel opening of a display region 100 to achieve a connection between the organic light-emitting layer 32 and an anode 31. Since the anode 31 is connected to a first drain electrode 24 of a first transistor, light emission control of the organic light-emitting layer 32 is achieved. A part of a cathode 33 is formed on the organic light-emitting layer 32. After this patterning process, a film structure of a second fan-out region 203 has not changed.

In some exemplary embodiments, an encapsulation layer 42 is formed on the substrate 10 on which the aforementioned patterns are formed. As shown in FIG. 7, an encapsulation layer 42 is formed in a display region 100, and may be made of a laminated structure of an inorganic material/an organic material/an inorganic material. An organic material layer is disposed between two inorganic material layers. After this patterning process, a film structure of a second fan-out region 203 has not changed.

In some exemplary embodiments, a planarization layer 16, a pixel definition layer 34, and a pillar spacer 41 may be made of organic materials such as polyimide, acrylic, or polyethylene terephthalate.

After the above film structures are prepared, a display substrate may be peeled off from a glass carrier plate by a peeling process. In the above preparation processes, a preparation process of a test circuit in a test circuit region is similar to a preparation process of a driving structure layer in a display region, which hence will not be repeated here.

According to a display substrate provided by the exemplary embodiments, a plurality of resistance compensation units are provided in a second fan-out region, and the resistance compensation units are connected in series with second sub-data fan-out lines to compensate resistance values of data fan-out lines in an entire fan-out region. Resistance value differences between different data fan-out lines that provide data signals to different data lines in a display region is reduced, thereby improving a display effect.

A preparation process according to the exemplary embodiments may be achieved by using existing mature preparation devices, may be well compatible with existing preparation processes, and has advantages of simple process realization, easy implementation, high production efficiency, low production cost, and high yield rate.

A structure and a preparation process of a display substrate shown in the exemplary embodiments are merely illustrative. In some exemplary embodiment, according to actual needs, corresponding structures may be changed and patterning processes may be added or reduced. For example, a plurality of resistance compensation units may all be disposed in a first fan-out region, and the plurality of resistance compensation units may be electrically connected to a plurality of first sub-data fan-out lines in one-to-one correspondence. Or, a plurality of resistance compensation units may be disposed in a third fan-out region and electrically connected to a plurality of third sub-data fan-out lines in one-to-one correspondence. Or, a part of resistance compensation units are disposed in a first fan-out region and electrically connected to first sub-data fan-out lines, and the other part of the resistance compensation units are disposed in a second fan-out region and electrically connected to second sub-data fan-out lines in series. Or, a part of resistance compensation units are disposed in a second fan-out region and electrically connected to second sub-data fan-out lines in series, and the other part of the resistance compensation units are disposed in a third fan-out region and electrically connected to third sub-data fan-out lines in series. In another example, an area of a semiconductor structure of each resistance compensation unit is the same, and a quantity of resistance compensation units connected in series may be determined according to a resistance value to be compensated for each data fan-out line. In another example, a plurality of data fan-out lines may be disposed in the same layer, for example, the plurality of data fan-out lines are of the same layer structure as a first gate metal layer of a display region or as a second gate metal layer. However, this is not limited in the embodiments.

A structure (or method) shown in the embodiments may be appropriately combined with a structure (or method) shown in other embodiments.

Figure 8:
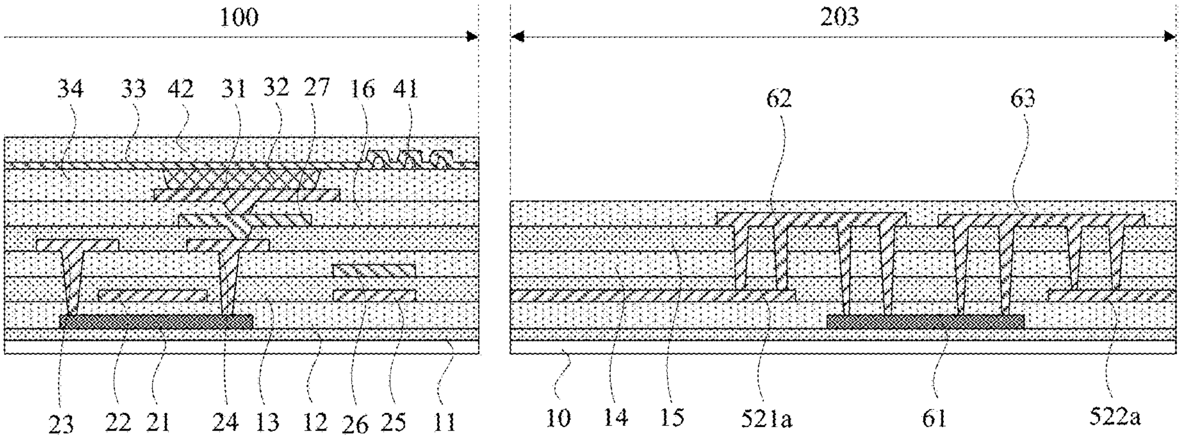
FIG. 8 is another schematic sectional view along the P-P direction in FIG. 2.

FIG. 8 is another schematic sectional view along a P-P direction in FIG. 2. In some exemplary embodiments, as shown in FIG. 8, in a plane perpendicular to a display substrate, a display region 100 includes a driving structure layer disposed on a substrate 10 and a light-emitting structure layer disposed on the driving structure layer. The driving structure layer includes a first insulating layer 11, an active layer (e.g., including a first active layer 21), a second insulating layer 12, a first gate metal layer (e.g., including a first gate electrode 22 and a first capacitor electrode 25), a third insulating layer 13, a second gate metal layer (e.g., including a second capacitor electrode 26), a fourth insulating layer 14, a first source-drain metal layer (e.g., including a first source electrode 23 and a first drain electrode 24), a fifth insulating layer 15, a second source-drain metal layer (e.g., including an anode connection electrode 27), and a planarization layer 16, which are sequentially disposed on the substrate 10. A semiconductor structure 61 of a resistance compensation unit disposed in a second fan-out region 203 is of the same layer structure as an active layer of the display region 100, and a conductive connection structure of a resistance compensation unit (e.g., including a first connection electrode 62 and a second connection electrode 63) is of the same layer structure as a second source-drain metal layer of the display region 100. However, this is not limited in the embodiments. For example, a conductive connection structure of a resistance compensation unit may be of the same layer structure as a first source-drain metal layer of a display region.

Other structures of a display region and a first bezel region in the exemplary embodiments are similar to corresponding structures described in the foregoing embodiments, which hence will not be repeated here.

A structure (or method) shown in the embodiments may be appropriately combined with a structure (or method) shown in other embodiments.

Figure 9:
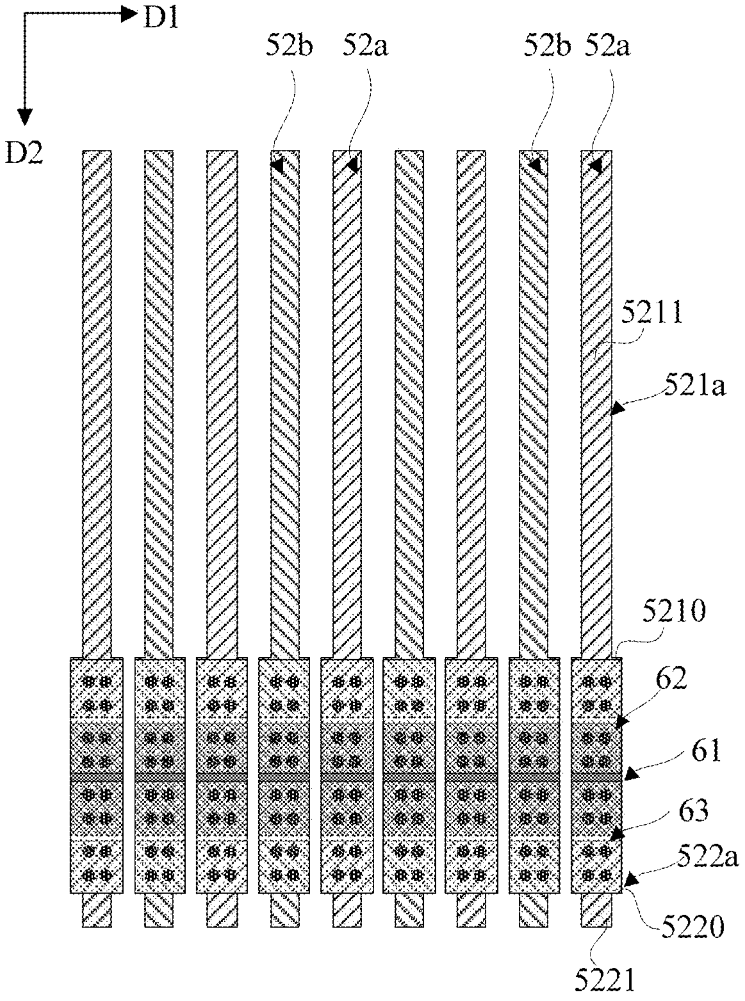
FIG. 9 is another partial enlarged schematic diagram of the region S in FIG. 2.

FIG. 9 is another partial enlarged schematic diagram of a region S in FIG. 2. In some exemplary embodiments, as shown in FIG. 9, a plurality of second sub-data fan-out lines 52*a* and a plurality of second sub-data fan-out lines 52*b* in a second fan-out region are disposed in different layers. For example, a second sub-data fan-out line 52*a* and a first gate metal layer in a display region are of the same layer structure, and a second sub-data fan-out line 52*b* and a second gate metal layer in the display region are of the same layer structure. In this example, a plurality of second sub-data fan-out lines in a second fan-out region are connected in series with a plurality of resistance compensation units in one-to-one correspondence, and the plurality of resistance compensation units are sequentially disposed along a first direction D1. The second sub-data fan-out line 52*a* includes a first part 521*a* and a second part 521*b* that are disconnected. The first part 521*a* of the second sub-data fan-out line 52*a* has a first terminal 5210 and a first extension portion 5211, and the second part 522*a* of the second sub-data fan-out line 52*a* has a second terminal 5220 and a second extension portion 5221. One terminal of a first connection electrode 62 of a resistance compensation unit is connected to the first terminal 5210 through four vias, and the other terminal of the first connection electrode 62 is connected to a semiconductor structure 61 through four vias. One terminal of a second connection electrode 63 is connected to the second terminal 5220 through four vias, and the other terminal of the second connection electrode 63 is connected to the semiconductor structure 61 through four vias. A length of the first terminal 5210 along the first direction D1 is greater than a length of the first extension portion 5211 along the first direction D1, and a length of the second terminal 5220 along the first direction D1 is greater than a length of the second extension portion 5221 along the first direction D1. The length of the first terminal 5210 along the first direction D1 may be approximately equal to the length of the second terminal 5220 along the first direction D1. However, this is not limited in the embodiments.

In some exemplary embodiments, as shown in FIG. 9, a length of a first connection electrode 62 along a first direction D1 is approximately equal to a length of a first terminal 5210 along the first direction D1, and a length of a second connection electrode 63 along the first direction D1 is approximately equal to a length of a second terminal 5220 along the first direction D1. A length of the first connection electrode 62 along the first direction D1 is approximately equal to a length of the second electrode 63 along the first direction D1. A semiconductor structure 61 is, for example, rectangular, and a length of the semiconductor structure 61 along the first direction D1 may be approximately equal to a length of the first connection electrode 62 along the first direction D1. However, this is not limited in the embodiments.

In some exemplary embodiments, as shown in FIG. 9, lengths of a plurality of semiconductor structures 61 along a first direction D1 may be the same, and lengths along a second direction D2 may vary, so that areas of the plurality of semiconductor structures 61 are different so as to compensate different resistance values for corresponding data fan-out lines. In this example, the lengths of the plurality of semiconductor structures along the second direction D2 may vary on an order of microns. For example, in a second fan-out region 231 of a second fan-out region 203 shown in FIG. 2, from an edge of the second fan-out region 203 to middle of the second fan-out region 203, lengths of a plurality of semiconductor structures along a first direction are the same, and lengths along a second direction may increase sequentially, for example, 3.04 microns, 3.11 microns, 3.18 microns, etc.

In some exemplary embodiments, a plurality of resistance compensation units in a second fan-out region are close to a test circuit region. That is, a distance between the plurality of resistance compensation units and the test circuit region is smaller than a distance between the plurality of resistance compensation units and a bending region. In some examples, extension lengths of second extension portions of second parts of a plurality of second sub-data fan-out lines are the same, and the second extension portions are sequentially disposed along a first direction. Extension lengths of first extension portions of first parts of a plurality of second sub-data fan-out lines are larger than the extension lengths of the second extension portions of the second parts. In the present disclosure, an extension length means a characteristic dimension along an extension direction.

In the exemplary embodiments, by providing a first terminal and a second terminal at a first part and a second part of a second sub-data fan-out line respectively, a contact area between the second sub-data fan-out line and a conductive connection structure of a resistance compensation unit may be increased on a basis of avoiding increasing an overall line width of the second sub-data fan-out line. Electrical connection effectiveness between the second sub-data fan-out line and the resistance compensation unit is thereby improved.

Other structures of a display region and a first bezel region in the exemplary embodiments are similar to corresponding structures described in the foregoing embodiments, which hence will not be repeated here.

A structure (or method) shown in the embodiments may be appropriately combined with a structure (or method) shown in other embodiments.

Figure 10:
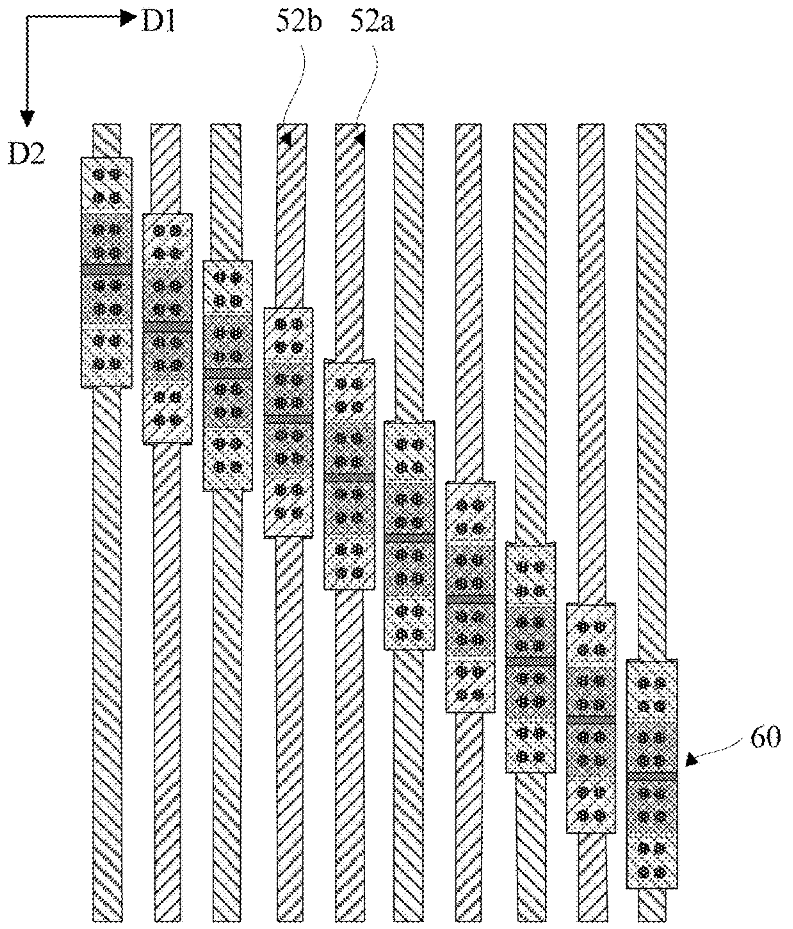
FIG. 10 is another partial enlarged schematic diagram of the region S in FIG. 2.

FIG. 10 is another partial enlarged schematic diagram of a region S in FIG. 2. In some exemplary embodiments, a plurality of second sub-data fan-out lines 52*a* and a plurality of second sub-data fan-out lines 52*b* in a second fan-out region are disposed in different layers. A plurality of second sub-data fan-out lines in the second fan-out region are connected in series with a plurality of resistance compensation units in one-to-one correspondence. A plurality of resistance compensation units 60 in each second fan-out sub-region are staggered along a second direction D2. For example, distances between a plurality of resistance compensation units in a second fan-out sub-region 231 of a second fan-out region 203 shown in FIG. 2 and a test circuit region may decrease from an edge to middle of the second fan-out region along a first direction D1, and distances between a plurality of resistance compensation units in a second fan-out sub-region 232 and the test circuit region may increase from the edge to the middle of the second fan-out region along the first direction D1. However, this is not limited in the embodiments.

Other structures of a display region and a first bezel region in the exemplary embodiments are similar to corresponding structures described in the foregoing embodiments, which hence will not be repeated here.

A structure (or method) shown in the embodiments may be appropriately combined with a structure (or method) shown in other embodiments.

Figure 11:
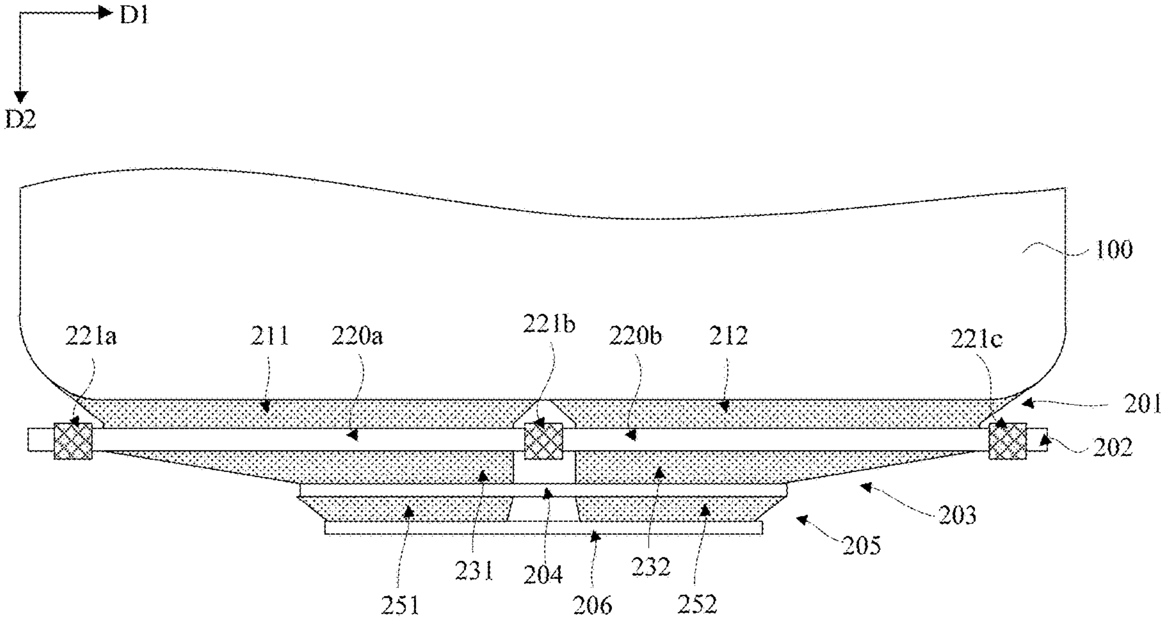
FIG. 11 is another schematic diagram of a first bezel region of a display substrate according to at least one embodiment of the present disclosure.

FIG. 11 is another schematic diagram of a first bezel region according to at least one embodiment of the present disclosure. In some exemplary embodiments, as shown in FIG. 11, a first bezel region 200 includes a first fan-out region 201 located on a side of a display region 100, a bending region 202 located on a side of the first fan-out region 201 away from the display region 100, a second fan-out region 203 located on a side of the bending region 202 away from the display region 100, a test circuit region 204 located on a side of the second fan-out region 203 away from the display region 100, a third fan-out region 205 located on a side of the test circuit region 204 away from the display region 100, and a signal access region 206 located on a side of the third fan-out region 205 away from the display region 100.

In some exemplary embodiments, as shown in FIG. 11, a first fan-out region 201 includes two first fan-out sub-regions 211 and 212. A plurality of first sub-data fan-out lines are disposed in each first fan-out sub-region. Lengths of a plurality of first sub-data fan-out lines in each first fan-out sub-region first decrease and then increase along a direction from an edge of the first fan-out region 201 to middle of the first fan-out region 201. A bending region 202 includes a plurality of first bending sub-regions (e.g., two first bending sub-regions 220*a* and 220*b* sequentially disposed along a first direction D1) and a plurality of second bending sub-regions (e.g., three second bending sub-regions 221*a*, 221*b*, and 221*c* sequentially disposed along the first direction D1). At least one second bending sub-region is provided between two adjacent first bending sub-regions. Each first bending sub-region is provided with a plurality of data connection lines, and each second bending sub-region is provided with a power connection line. The second bending sub-region 221*b* is located between the first bending sub-regions 220*a* and 220*b*. A second fan-out region 203 includes two second fan-out sub-regions 231 and 232. A plurality of second sub-data fan-out lines are disposed in each second fan-out sub-region. Lengths of a plurality of second sub-data fan-out lines in each second fan-out sub-region first decrease and then increase along a direction from an edge of the second fan-out region 203 to middle of the second fan-out region 203. A third fan-out region 205 includes two third fan-out sub-regions 251 and 252. A plurality of third sub-data fan-out lines are disposed in each third fan-out sub-region. Lengths of a plurality of third sub-data fan-out lines in each third fan-out sub-region first decrease and then increase along a direction from an edge of the third fan-out region 205 to middle of the third fan-out region 205. However, this is not limited in the embodiments. For example, lengths of a plurality of first sub-data fan-out lines in each first fan-out sub-region may decrease along a direction from an edge of a first fan-out region to middle of the first fan-out region; lengths of a plurality of second sub-data fan-out lines in each second fan-out sub-region may decrease along a direction from an edge of a second fan-out region to middle of the second fan-out region; and lengths of a plurality of third sub-data fan-out lines in each third fan-out sub-region may decrease along a direction from an edge of a third fan-out region to middle of the third fan-out region.

In some exemplary embodiments, when a plurality of resistance compensation units are provided in a second fan-out region 203 and are connected in series with and electrically connected to a plurality of second sub-data fan-out lines in the second fan-out region 203 in one-to-one correspondence, areas of semiconductor structures of a plurality of resistance compensation units in each second fan-out region may first increase and then decrease along a direction from an edge of the second fan-out region 203 to middle of the second fan-out region 203 to compensate resistance value differences among a plurality of data fan-out lines in a fan-out region, and improve display color deviation or uneven brightness caused by resistance value differences of data fan-out lines, thereby improving a display effect. In some examples, in a case where data fan-out lines of a fan-out region decreases in a first direction from an edge to middle along the fan-out region, areas of semiconductor structures of a plurality of resistance compensation units in each second fan-out region may increase along a direction from an edge of a second fan-out region to middle of the second fan-out region.

Structures of a display region, a first bezel region, and a resistance compensation unit in the exemplary embodiments are similar to corresponding structures described in the foregoing embodiments, which hence will not be repeated here.

A structure (or method) shown in the embodiments may be appropriately combined with a structure (or method) shown in other embodiments.

Figure 12:
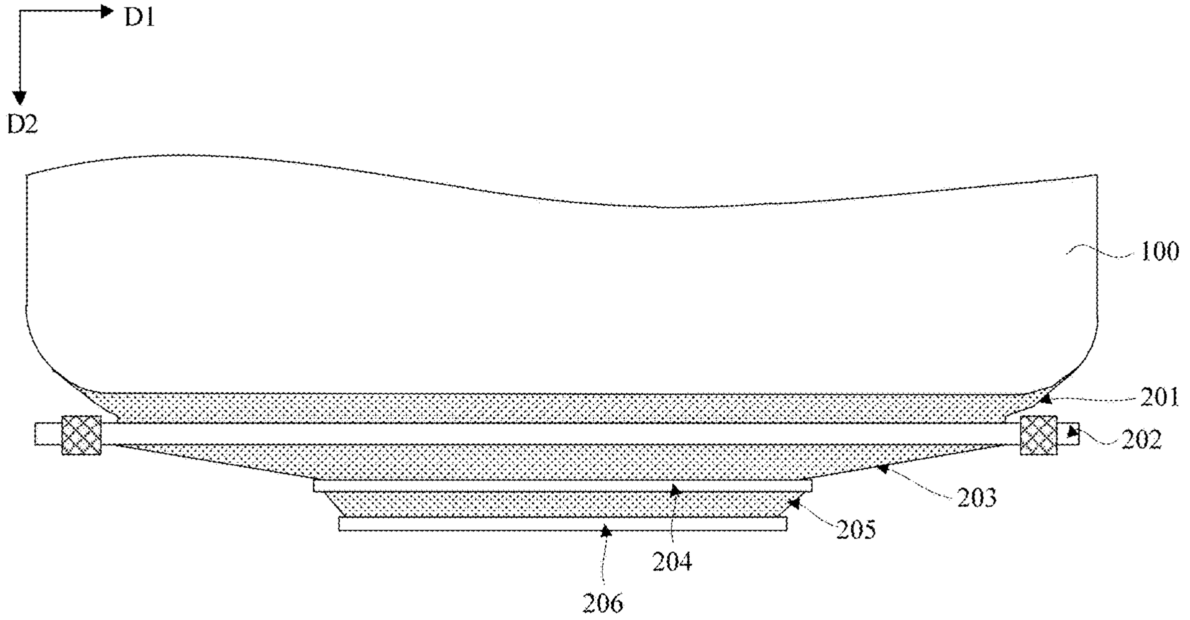
FIG. 12 is another schematic diagram of a first bezel region of a display substrate according to at least one embodiment of the present disclosure.

FIG. 12 is another schematic diagram of a first bezel region according to at least one embodiment of the present disclosure. In some exemplary embodiments, as shown in FIG. 12, a first bezel region 200 includes a first fan-out region 201 located on a side of a display region 100, a bending region 202 located on a side of the first fan-out region 201 away from the display region 100, a second fan-out region 203 located on a side of the bending region 202 away from the display region 100, a test circuit region 204 located on a side of the second fan-out region 203 away from the display region 100, a third fan-out region 205 located on a side of the test circuit region 204 away from the display region 100, and a signal access region 206 located on a side of the third fan-out region 205 away from the display region 100.

In some exemplary embodiments, as shown in FIG. 12, power connection lines in a bending region 202 are disposed in the same layer as data connection lines, and the power connection lines in the bending region 202 are located on both sides of a plurality of data connection lines. In this example, since the power connection lines in the bending region 202 are not disposed in middle of a plurality of data connection lines, the plurality of data connection lines may be sequentially connected to first sub-data fan-out lines of a first fan-out region 201 and second sub-data fan-out lines of a second fan-out region 203, and there is no jump in lengths of data fan-out lines of a fan-out region. Lengths of data fan-out lines in the first fan-out region 201, the second fan-out region 203, and the third fan-out region 205, decrease along a direction from an edge to middle. In some examples, when a plurality of resistance compensation units are provided in a second fan-out region 203 and connected in series with a plurality of second sub-data fan-out lines in the second fan-out region 203 in one-to-one correspondence, areas of semiconductor structures of the plurality of resistance compensation units may increase along a direction from both edges of the second fan-out region 203 to middle of the second fan-out region 203 to compensate resistance value differences among data fan-out lines in a fan-out region, and improve display color deviation or uneven brightness caused by resistance value differences of data fan-out lines, thereby improving a display effect.

In some exemplary embodiments, a plurality of resistance compensation units are all disposed in a second fan-out region 203 and connected in series with a plurality of second sub-data fan-out lines in the second fan-out region in one-to-one correspondence. A second sub-data fan-out line in the second fan-out region may include a first part and a second part that are disconnected. A resistance compensation unit may include a semiconductor structure and a conductive connection structure. The conductive connection structure includes a first connection electrode and a second connection electrode. The first connection electrode is connected to the first part of the second sub-data fan-out line and one terminal of the semiconductor structure, and the second connection electrode is connected to the second part of the second sub-data fan-out line and the other terminal of the semiconductor structure, thereby achieving a series electrical connection between the resistance compensation unit and the second sub-data fan-out line.

In some exemplary embodiments, a plurality of resistance compensation units may be disposed in sequence along a first direction D1, lengths of semiconductor structures of the plurality of resistance compensation units along the first direction D1 may be the same, and lengths along a second direction D2 may increase from both edges of a second fan-out region to middle of the second fan-out region, so that areas of the semiconductor structures of the plurality of resistance compensation units may increase along the direction from both edges of the second fan-out region to the middle of the second fan-out region. However, this is not limited in the embodiments.

Structures of a display region, a first bezel region, and a resistance compensation unit in the exemplary embodiments are similar to corresponding structures described in the foregoing embodiments, which hence will not be repeated here.

A structure (or method) shown in the embodiments may be appropriately combined with a structure (or method) shown in other embodiments.

Figure 13:
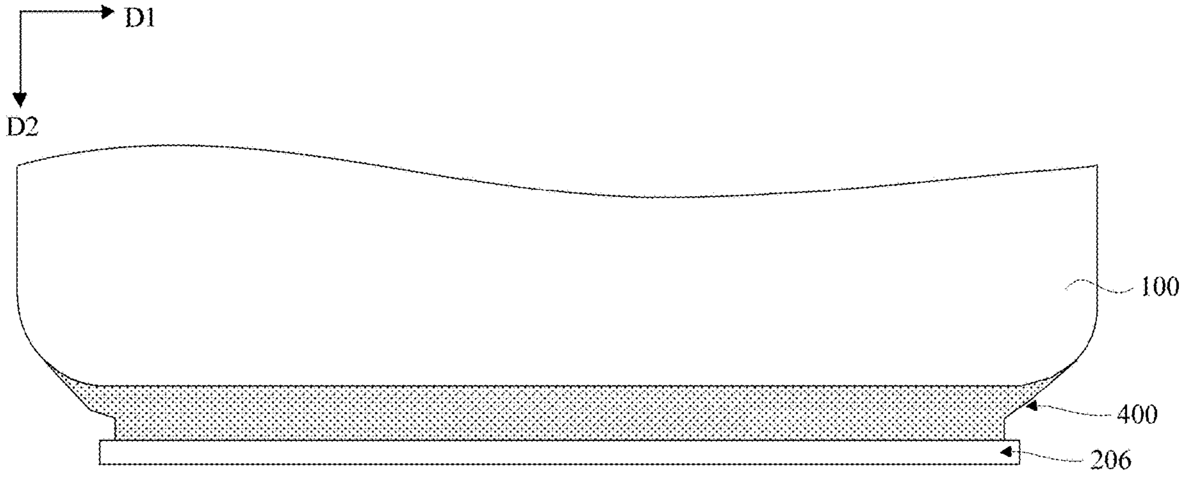
FIG. 13 is another schematic diagram of a first bezel region of a display substrate according to at least one embodiment of the present disclosure.

FIG. 13 is another schematic diagram of a first bezel region according to at least one embodiment of the present disclosure. In some exemplary embodiments, as shown in FIG. 13, a first bezel region 200 includes a fan-out region 400 located on a side of a display region 100 and a signal access region 206 located on a side of the fan-out region 400 away from the display region 100. The fan-out region 400 is provided with a plurality of data fan-out lines, and lengths of the plurality of data fan-out lines decrease along a direction from both edges of the fan-out region 400 to middle of the fan-out region 400. In some examples, when a plurality of resistance compensation units are provided in a fan-out region 400 and connected in series with a plurality of sub-data fan-out lines in the fan-out region in one-to-one correspondence, areas of semiconductor structures of the plurality of resistance compensation units may increase along a first direction D1 from both edges of the fan-out region 400 to middle of the fan-out region 400 to compensate resistance value differences among data fan-out lines in a fan-out region, and improve display color deviation or uneven brightness caused by the resistance value differences of the data fan-out lines, thereby improving a display effect.

Structures of a display region, a first bezel region, and a resistance compensation unit in the exemplary embodiments are similar to corresponding structures described in the foregoing embodiments, which hence will not be repeated here.

A structure (or method) shown in the embodiments may be appropriately combined with a structure (or method) shown in other embodiments.

Figure 14:
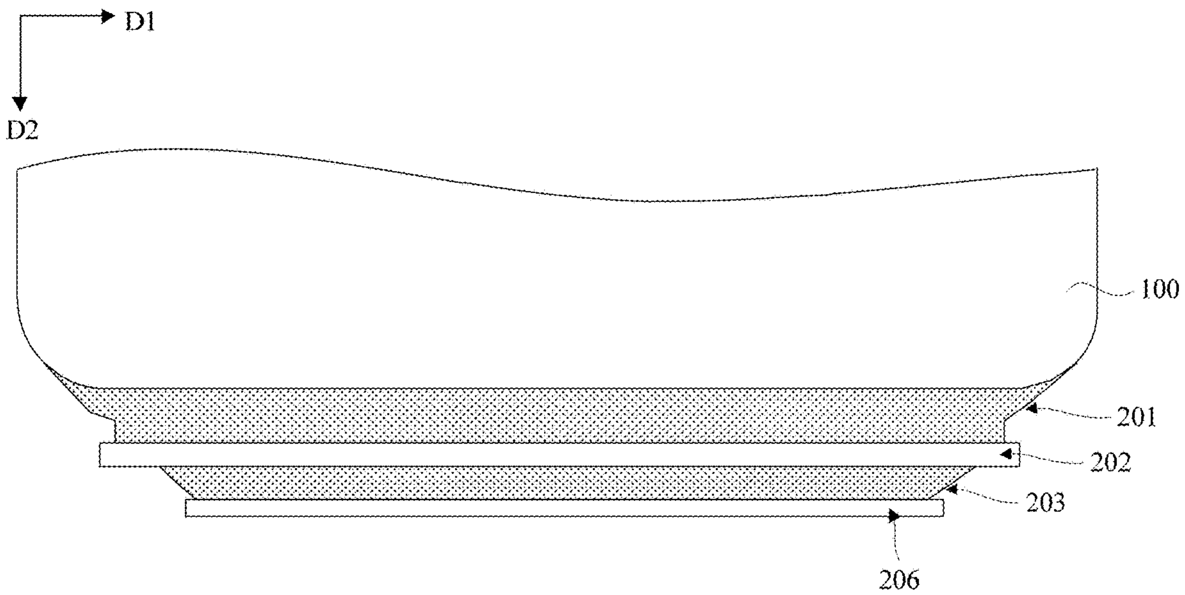
FIG. 14 is another schematic diagram of a first bezel region of a display substrate according to at least one embodiment of the present disclosure.

FIG. 14 is another schematic diagram of a first bezel region according to at least one embodiment of the present disclosure. In some exemplary embodiments, as shown in FIG. 14, a first bezel region 200 includes a first fan-out region 201 located on a side of a display region 100, a bending region 202 located on a side of the first fan-out region 201 away from the display region 100, a second fan-out region 203 located on a side of the bending region 202 away from the display region 100, and a signal access region 206 located on a side of the second fan-out region 203 away from the display region 100. A fan-out region includes a first fan-out region 201 and a second fan-out region 203. The second fan-out region 203 is provided with a plurality of second sub-data fan-out lines, and lengths of the plurality of second sub-data fan-out lines decrease along a direction from both edges of the second fan-out region 203 to middle of the second fan-out region 203.

In some examples, when a plurality of resistance compensation units are provided in a second fan-out region 203 and connected in series with a plurality of second sub-data fan-out lines in the second fan-out region 203 in one-to-one correspondence, areas of semiconductor structures of the plurality of resistance compensation units may increase along a direction from both edges of the second fan-out region 203 to middle of the second fan-out region 203 to compensate resistance value differences among data fan-out lines in a fan-out region, and improve display color deviation or uneven brightness caused by the resistance value differences of the data fan-out lines, thereby improving a display effect.

Structures of a display region, a first bezel region, and a resistance compensation unit in the exemplary embodiments are similar to corresponding structures described in the foregoing embodiments, which hence will not be repeated here.

A structure (or method) shown in the embodiments may be appropriately combined with a structure (or method) shown in other embodiments.

Figure 15:
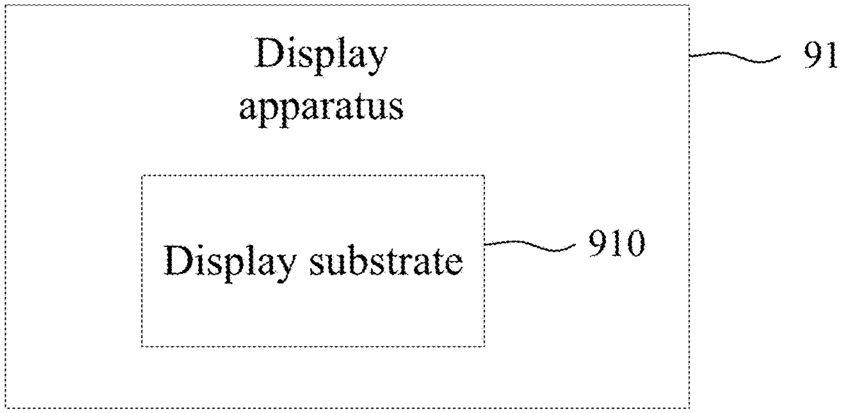
FIG. 15 is a schematic diagram of a display apparatus according to at least one embodiment of the present disclosure.

FIG. 15 is a schematic diagram of a display apparatus according to at least one embodiment of the present disclosure. As shown in FIG. 15, the embodiment provides a display apparatus 91, which includes a display substrate 910. The display substrate 910 is a display substrate provided in the foregoing embodiments. The display substrate 910 may be an OLED display substrate. The display apparatus 910 may be any product or component with a display function such as an OLED display apparatus, a cell phone, a tablet computer, a television, a display, a laptop computer, a digital photo frame, a navigator. However, this is not limited in the embodiment.

The drawings in the present disclosure only refer to structures involved in the present disclosure, and other structures may refer to common designs. The embodiments of the present disclosure and features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising:

a substrate, comprising a display region and a bezel region located on a periphery of the display region, wherein the bezel region comprises: a signal access region located on a side of the display region, a fan-out region located between the display region and the signal access region and a bending region located between the signal access region and the display region;

a plurality of sub-pixels, located in the display region;

a plurality of data lines, located in the display region and electrically connected to the plurality of sub-pixels, wherein the plurality of data lines are configured to provide data signals to the plurality of sub-pixels;

a plurality of signal input pads, located in the signal access region;

a data fan-out line layer, disposed in the fan-out region, wherein the data fan-out line layer comprises a plurality of data fan-out lines configured to be connected to the plurality of data lines and the plurality of signal input pads; and a plurality of resistance compensation units, disposed in the fan-out region, wherein at least one resistance compensation unit of the plurality of resistance compensation units has a conductive connection structure and a semiconductor structure, wherein:

at least one data fan-out line of the plurality of data fan-out lines is connected in series and electrically with the at least one resistance compensation unit, the bending region comprises a plurality of first bending sub-regions and a plurality of second bending sub-regions, the plurality of first bending sub-regions and the plurality of second bending sub-regions are disposed along a first direction perpendicular to an extension direction of the data lines of the display region, at least one second bending sub-region is provided between two adjacent first bending sub-regions, each first bending sub-region is provided with a plurality of data connection lines, and each second bending sub-region is provided with at least one power connection line;

the fan-out region has a plurality of fan-out sub-regions in the first direction, the plurality of fan-out sub-regions correspond to the plurality of first bending sub-regions in one-to-one correspondence, and a plurality of data fan-out lines in each fan-out sub-region of the plurality of fan-out sub-regions are connected to the plurality of data connection lines in a corresponding first bending sub-region in one-to-one correspondence;

a plurality of data fan-out lines in at least one fan-out sub-region are connected in series and electrically with a portion of the plurality of resistance compensation units in one-to-one correspondence, the bezel region further comprises a test circuit region between the bending region and the signal access region;

the fan-out region comprises a first fan-out region, a second fan-out region and a third fan-out region in a second direction, the second direction being perpendicular to the first direction, wherein the first fan-out region is located between the display region and the bending region, the second fan-out region is located between the bending region and the test circuit region, and the third fan-out region is located between the test circuit region and the signal access region;

the bending region is configured to enable the second fan-out region, the test circuit region, the third fan-out region and the signal access region to bend to a back side of the display region;

the first fan-out region comprises a plurality of first fan-out sub-regions, the plurality of first fan-out sub-regions comprises a first first fan-out sub-region, a second first fan-out sub-region, a third first fan-out sub-region and a fourth first fan-out sub-region disposed in sequence along the first direction; a plurality of first sub-data fan-out lines are disposed in each of the first fan-out sub-regions; lengths of the plurality of first sub-data fan-out lines in the first first fan-out sub-region located on a left edge of the first fan-out region decrease along a direction from the left edge of the first fan-out region to middle of the first fan-out region; lengths of the plurality of first sub-data fan-out lines in the fourth first fan-out sub-region located on a right edge of the first fan-out region decrease along a direction from the right edge of the first fan-out region to the middle of the first fan-out region; lengths of the plurality of first sub-data fan-out lines in the second first fan-out sub-region located on a right side of the first first fan-out sub-region first decrease and then increase along the direction from the left edge of the first fan-out region to the middle of the first fan-out region; lengths of the plurality of first sub-data fan-out lines in the third first fan-out sub-region located on a left side of the fourth first fan-out sub-region first decrease and then increase along the direction from the right edge of the first fan-out region to the middle of the first fan-out region;

the second fan-out region comprises a plurality of second fan-out sub-regions, the plurality of second fan-out sub-regions comprises a first second fan-out sub-region, a second second fan-out sub-region, a third second fan-out sub-region and a fourth second fan-out sub-region disposed in sequence along the first direction; a plurality of second sub-data fan-out lines are disposed in each of the second fan-out sub-regions; lengths of the plurality of second sub-data fan-out lines in each of the second fan-out sub-regions decrease along a direction from an edge of the second fan-out region to middle of the second fan-out region;

the third fan-out region comprises a plurality of third fan-out sub-regions, the plurality of third fan-out sub-regions comprises a first third fan-out sub-region and a second third fan-out sub-region disposed in sequence along the first direction; each of the third fan-out sub-regions is provided with a plurality of third sub-data fan-out lines, lengths of the plurality of third sub-data fan-out lines in each of the plurality of third fan-out sub-regions first decrease and then increase along a direction from an edge of the third fan-out region to middle of the third fan-out region;

a distance between the resistance compensation unit in the second fan-out region and the bending region is greater than a distance between the resistance compensation unit and the test circuit region; and distances between the plurality of resistance compensation units in the first second fan-out sub-region of the second fan-out region and the test circuit region decrease from the edge to the middle of the second fan-out region along the first direction, and distances between the plurality of resistance compensation units in the second second fan-out sub-region and the test circuit region increase from the edge to the middle of the second fan-out region along the first direction.

2. The display substrate of claim 1, wherein an area of the semiconductor structure of the resistance compensation unit is positively proportional to a resistance value to be compensated for the data fan-out line connected in series with the resistance compensation unit.

3. The display substrate of claim 2, wherein an area of a semiconductor structure of the resistance compensation units connected in series with the data fan-out lines with a smaller resistance value is larger than an area of a semiconductor structure of the resistance compensation units connected in series with the data fan-out lines with a larger resistance value.

4. The display substrate of claim 1, wherein the semiconductor structure and the conductive connection structure are sequentially disposed on the substrate and are electrically connected.

5. The display substrate of claim 4, wherein the conductive connection structure of the resistance compensation unit comprises a first connection electrode and a second connection electrode;

the data fan-out line connected in series with the resistance compensation unit comprises a first part and a second part that are disconnected; the first part of the data fan-out line is connected to the semiconductor structure of the resistance compensation unit through the first connection electrode, and the second part of the data fan-out line is connected to the semiconductor structure through the second connection electrode.

6. The display substrate of claim 5, wherein the first part has a first terminal and a first extension portion connected to each other, and the second part has a second terminal and a second extension portion connected to each other; the first terminal is connected to the semiconductor structure through the first connection electrode, and the second terminal is connected to the semiconductor structure through the second connection electrode;

a length of the first terminal along the first direction is greater than a length of the first extension portion along the first direction, and a length of the second terminal along the first direction is greater than a length of the second extension portion along the first direction; and the first direction is perpendicular to an extension direction of data lines in the display region.

7. The display substrate of claim 1, wherein the plurality of resistance compensation units are sequentially disposed along a direction perpendicular to an extension direction of data lines of the display region, or staggered along a direction parallel to the extension direction of the data lines of the display region.

8. The display substrate of claim 1, wherein the portion of the plurality of resistance compensation units electrically connected to the plurality of data fan-out lines in the at least one fan-out sub-region are sequentially disposed along the first direction, or staggered along a direction parallel to the extension direction of the data lines of the display region.

9. The display substrate of claim 1, wherein the semiconductor structure of the resistance compensation unit is located on a side of the data fan-out line layer close to the substrate, and the conductive connection structure of the resistance compensation unit is located on a side of the data fan-out line layer away from the substrate.

10. The display substrate of claim 1, wherein the at least one data fan-out line comprises a first sub-data fan-out line located in the first fan-out region and a second sub-data fan-out line located in the second fan-out region and connected to the first sub-data fan-out line;

the at least one resistance compensation unit is configured to satisfy one of the following:

disposed in the first fan-out region, connected in series and electrically with at least one first sub-data fan-out line; and disposed in the second fan-out region, connected in series and electrically with at least one second sub-data fan-out line.

11. The display substrate of claim 1, wherein the at least one data fan-out line comprises a first sub-data fan-out line located in the first fan-out region, a second sub-data fan-out line located in the second fan-out region and electrically connected to the first sub-data fan-out line, and a third sub-data fan-out line located in the third fan-out region and electrically connected to the second sub-data fan-out line;

the at least one resistance compensation unit is configured to satisfy one of the following:

disposed in the first fan-out region, connected in series and electrically with at least one first sub-data fan-out line;

disposed in the second fan-out region, connected in series and electrically with at least one second sub-data fan-out line; and disposed in the third fan-out region, connected in series and electrically with at least one third sub-data fan-out line.

12. The display substrate of claim 10, wherein the plurality of resistance compensation units are all disposed in the second fan-out region, and at least one second sub-data fan-out line in the second fan-out region is connected in series and electrically with at least one resistance compensation unit.

13. The display substrate of claim 12, wherein the plurality of resistance compensation units disposed in the second fan-out region are close to the test circuit region or close to the signal access region.

14. The display substrate of claim 1, wherein the data fan-out line layer comprises a first data fan-out line layer and a second data fan-out line layer which are sequentially disposed on the substrate and insulated from each other;

the first data fan-out line layer comprises a plurality of first data fan-out lines, and the second data fan-out line layer comprises a plurality of second data fan-out lines;

orthographic projections of the first data fan-out line layer and the second data fan-out line layer on the substrate are not overlapped, and the plurality of first data fan-out lines and the plurality of second data fan-out lines are disposed at intervals.

15. The display substrate of claim 14, wherein the display region at least comprises a driving structure layer disposed on the substrate and light-emitting elements disposed on the driving structure layer; the light-emitting elements are electrically connected to the driving structure layer;

the driving structure layer comprises: an active layer, a first gate metal layer, a second gate metal layer, and a source-drain metal layer sequentially disposed on the substrate;

the first data fan-out line layer and the first gate metal layer are in a same layer, and the second data fan-out line layer and the second gate metal layer are in a same layer; the semiconductor structure of the resistance compensation unit and the active layer are in a same layer; and the conductive connection structure of the resistance compensation unit and the source-drain metal layer are in a same layer.

16. A display apparatus, comprising the display substrate of claim 1.

17. The display substrate of claim 11, wherein the plurality of resistance compensation units are all disposed in the second fan-out region, and at least one second sub-data fan-out line in the second fan-out region is connected in series and electrically with at least one resistance compensation unit.

* * * * *